(12) United States Patent
Hieda et al.

(10) Patent No.: US 7,196,466 B2
(45) Date of Patent: Mar. 27, 2007

(54) ORGANIC ELECTROLUMINESCENCE DEVICE SUPPRESSING BRIGHTNESS UNEVENNESS

(75) Inventors: Masato Hieda, Kariya (JP); Kentaro Yamashita, Kariya (JP); Yoshifumi Kato, Kariya (JP); Mitsuharu Muta, Kariya (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 131 days.

(21) Appl. No.: 10/926,383

(22) Filed: Aug. 25, 2004

(65) Prior Publication Data
US 2005/0052124 A1 Mar. 10, 2005

(30) Foreign Application Priority Data
Aug. 29, 2003 (JP) ............................. 2003-307258
Oct. 10, 2003 (JP) ............................. 2003-351675

(51) Int. Cl.
*H01J 1/62* (2006.01)
*H01J 63/04* (2006.01)

(52) U.S. Cl. ..................... 313/505; 313/504; 313/498; 257/E21.705

(58) Field of Classification Search ................ 313/505
See application file for complete search history.

(56) References Cited

U.S. PATENT DOCUMENTS 6,362,027 B1 * 3/2002 Yamazaki et al. .......... 438/149
6,563,557 B2 * 5/2003 Yamanaka et al. ........... 349/74
2003/0047730 A1 * 3/2003 Konuma ...................... 257/42
2003/0047736 A1    3/2003 Hayashi et al. .............. 257/79
2004/0263441 A1 * 12/2004 Tanaka et al. ............... 345/76
2005/0077818 A1 *  4/2005 Hieda et al. ................ 313/504

FOREIGN PATENT DOCUMENTS

JP    11-40362    2/1999
SU    547981      7/1977

OTHER PUBLICATIONS

Database WPI, Section EI, Week 197815, Derwent Publications Ltd., London, GB, Class U14, AN 1978-D02208A.

* cited by examiner

*Primary Examiner*—Nimeshkumar D. Patel
*Assistant Examiner*—Peter Macchiarolo
(74) *Attorney, Agent, or Firm*—Morgan & Finnegan, L.L.P.

(57) ABSTRACT

An electrode of the organic EL device includes a substantially rectangular electrode region that contacts an organic layer, a terminal section to which an external drive circuit is connected, and a conductive section that electrically connects the terminal section to the electrode region. The conductive section includes a first joint connected to the terminal section, a second joint connected to the outer periphery of the electrode region, and a conductive section main body that extends between the first joint and the second joint to electrically connect the first joint to the second joint. Therefore, the difference of magnitude between currents flowing at respective positions in a luminous region in the organic EL device is lessened.

19 Claims, 16 Drawing Sheets

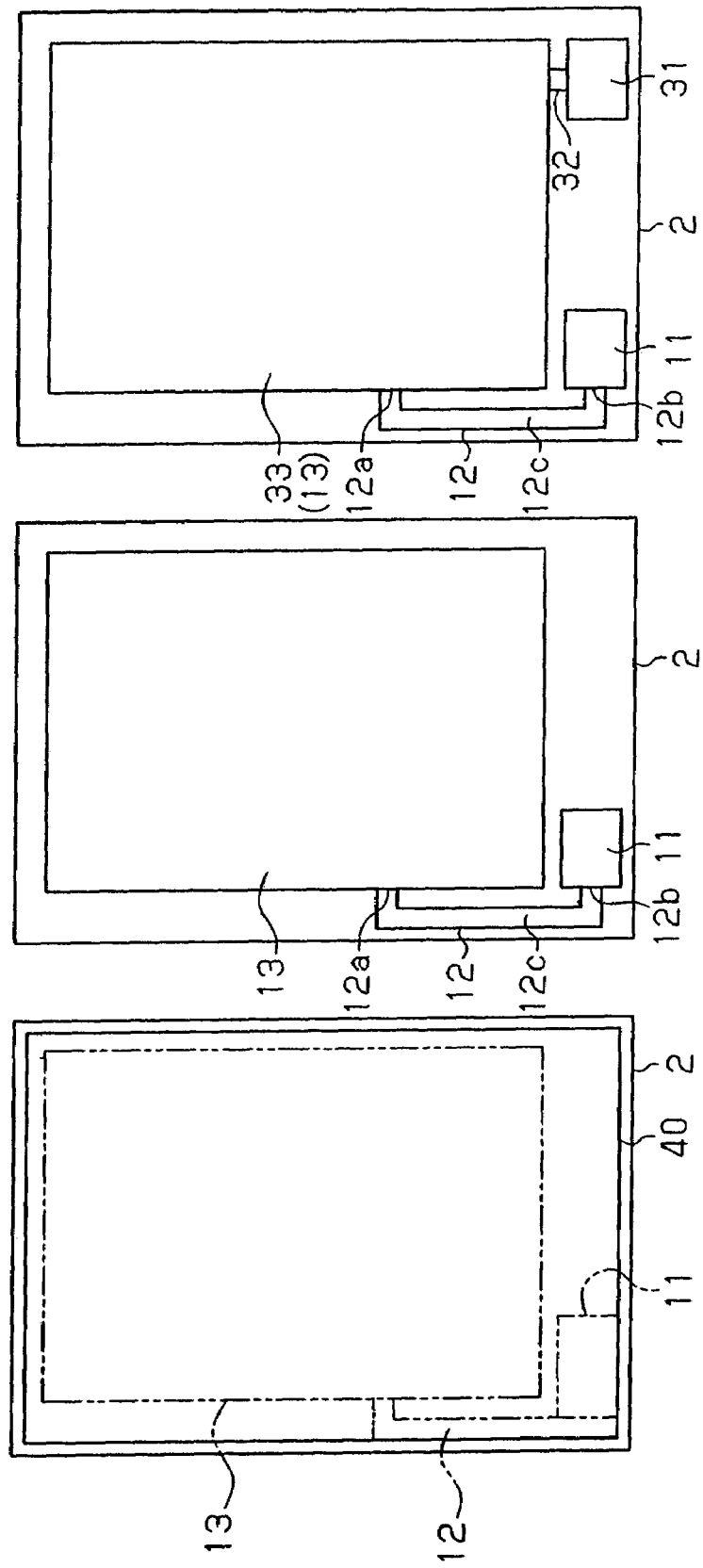

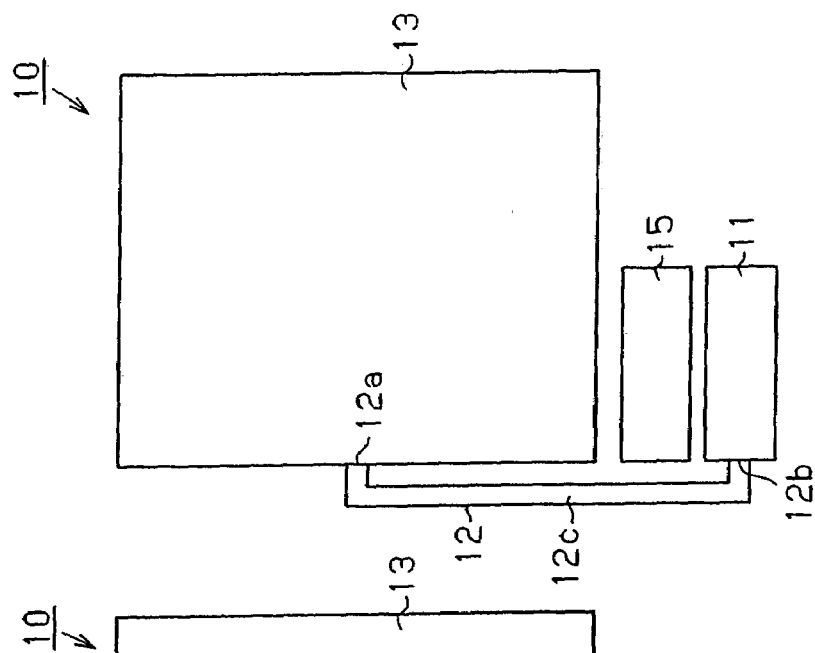
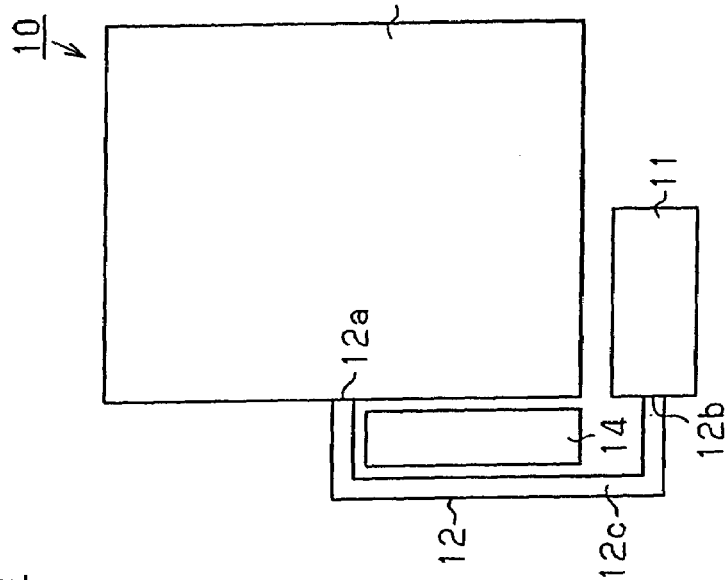
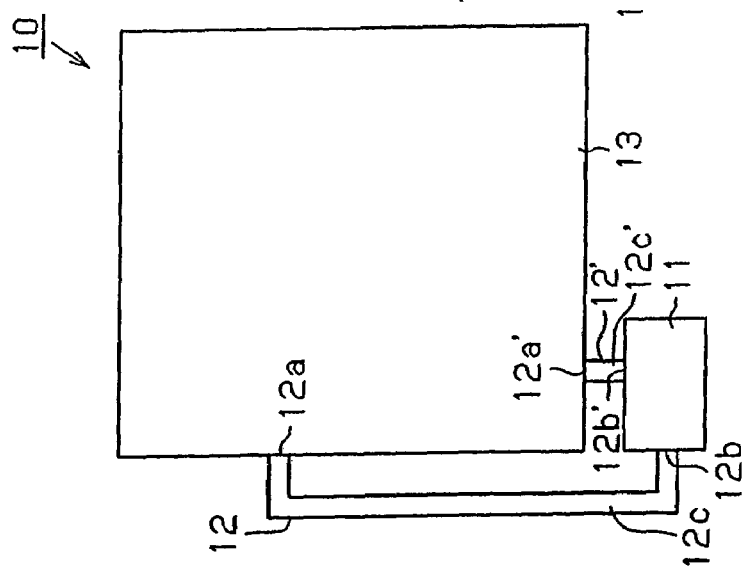

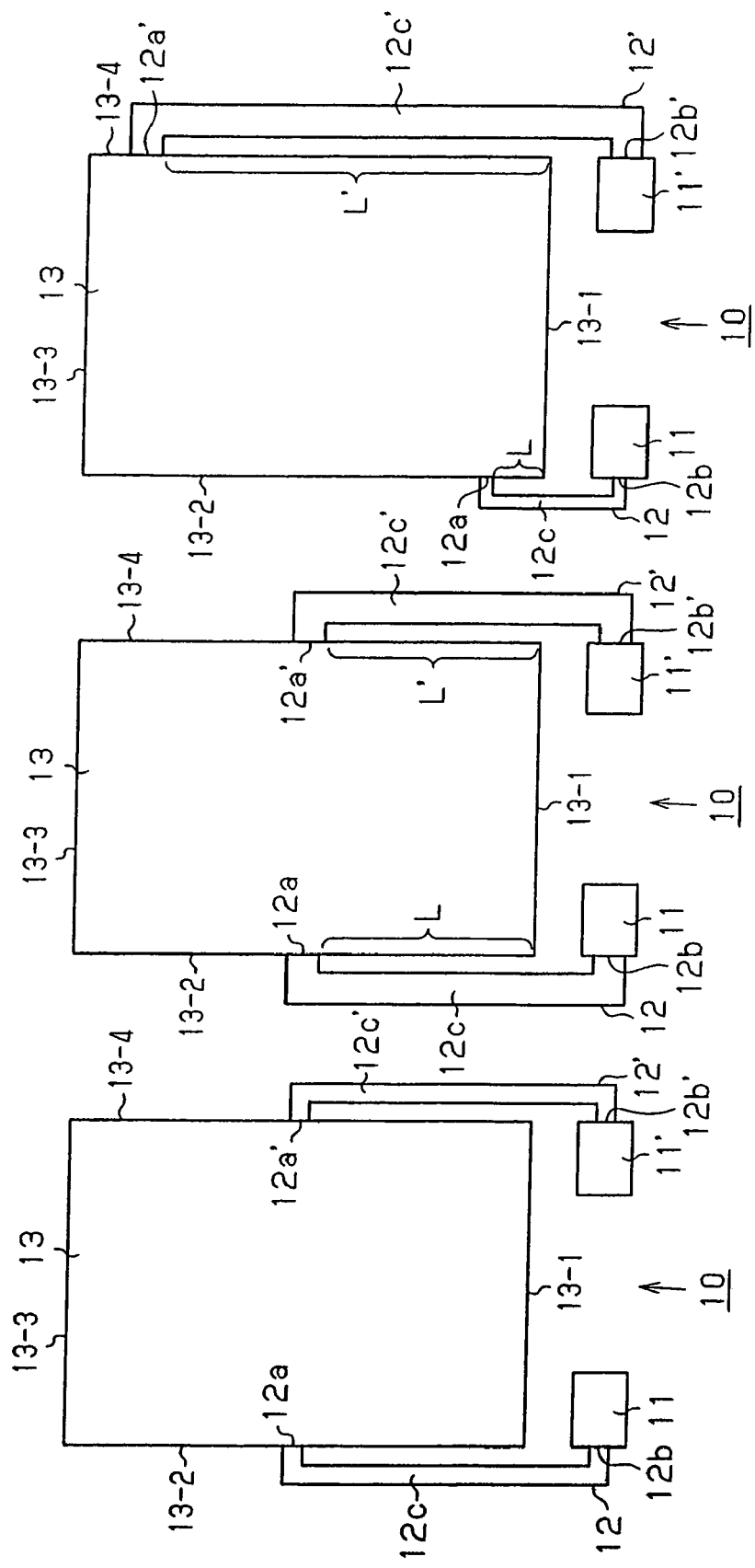

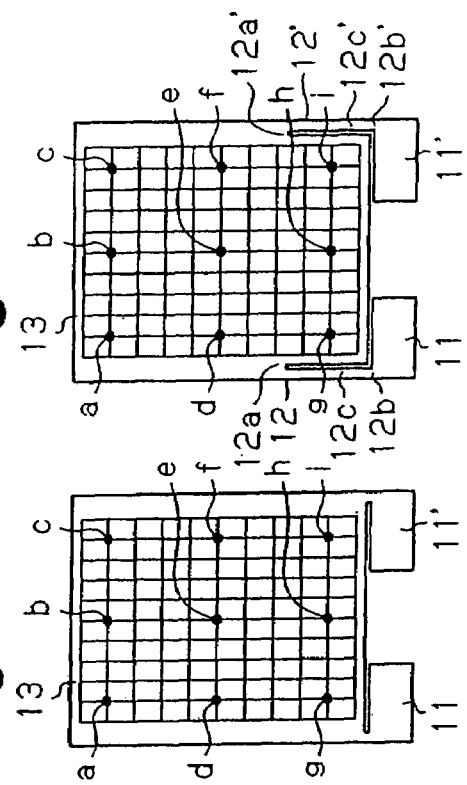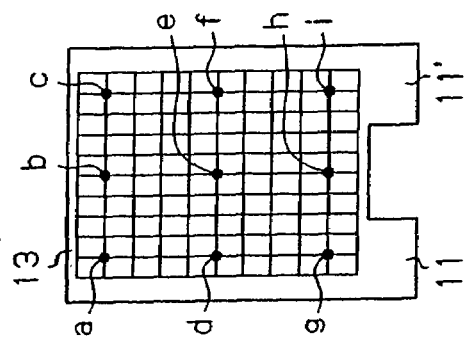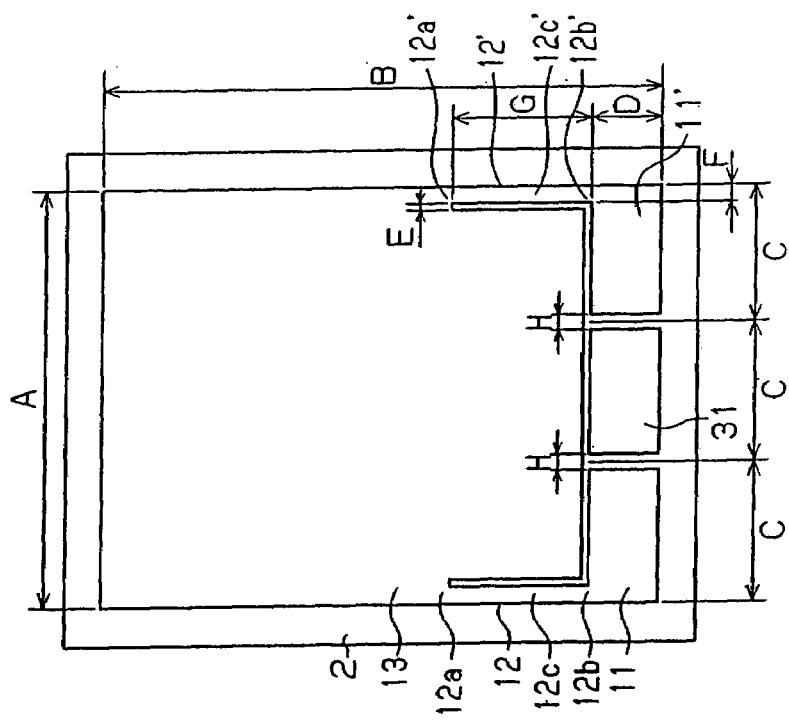

ORGANIC ELECTROLUMINESCENCE DEVICE SUPPRESSING BRIGHTNESS UNEVENNESS

BACKGROUND OF THE INVENTION

1. Field of the Invention

The present invention relates to an organic electroluminescence device whose luminous region is substantially rectangular.

2. Description of the Related Art

Electrodes of an organic electroluminescence device have various restrictions such as a restriction that at least one electrode must have optical transparency, and a restriction that electrodes must be constituted by a material and production method which do not deteriorate an organic layer, and the like. Therefore, the material adoptable as electrodes of an organic electroluminescence device is limited extremely.

In addition, since an apparatus (for example, personal digital assistant etc.) equipped with an organic electroluminescence device has a limit in its size, the size of the device concerned also has restrictions. In consequence, the size and located positions of terminal sections of electrodes are also limited.

As a result, in plenty of respective current paths in which currents in the organic electroluminescence device flow, those resistances may largely differ. For this reason, for example, the following problems have occurred.

Occurrence of Brightness Unevenness

Since locations where rich currents flow and locations where poor currents flow exist, brightness unevenness occurs as the entire device. This is because, since the luminance of the organic electroluminescence device becomes high as a flowing current becomes large, the difference of luminance occurs between both to become brightness unevenness, when a location where a rich current flows and a location where a poor current flows exist.

Occurrence of Lifetime Difference in Device

The lifetimes in a device differ in a location through which a rich current flows, and a location through which a poor current flows. Generally, a lifetime of a portion through which a rich current flows becomes short. For this reason, a location, which has a short lifetime in comparison with a device where a uniform current flows, exists, and hence, a lifetime as the organic electroluminescence device becomes short. In addition, when an organic electroluminescence device is used for a long time, a location not shining arises or a location whose luminance is lower than that of other locations arises.

Problems Such as Deterioration

Since a location through which a rich current flows and a location through which a poor current flows exist, a location being deteriorated may arise.

Occurrence of Chromaticity Unevenness

Since there are a location through which a rich current flows and a location through which a poor current flows, in a device, an S-S annihilation phenomenon arises in the case of an organic electroluminescence device using a fluorescent material, or a T-T annihilation phenomenon arises in the case of an organic electroluminescence device using a phosphorescence material, hence, in an organic, electroluminescence device which contains a plurality of luminescent materials in its luminescent layer, and in which each luminescent material emits a color with a wavelength different from at least one other luminescent material, it may arise that the luminance of each layer differs from others at a location where a current is easy to flow and a location where a current is hard to flow. As a result, the chromaticity unevenness may arise.

As for these problems, their advantages could be made small if, for example, it were possible to produce an organic electroluminescence device only with materials having small volume resistivity values, or a terminal section over the entire circumference of the device could be provided. But, since there are various restrictions as described above, they have actually arisen.

Hereinafter, resistance difference between respective paths, in which currents flow, in an organic electroluminescence device will be explained in detail by using FIG. 26.

In the organic electroluminescence device used for explanation here, an electrode provided in an optical output side rather than an organic layer is an anode formed of ITO, and a cathode, which faces the anode, is formed of aluminum, in this structure, since the volume resistivity or aluminum is very small in comparison with that of ITO, its volume resistivity can be disregarded substantially. Hence, only the anode which poses a problem (which is an electrode with high volume resistivity) at the time of considering the resistance difference between respective paths is shown in FIG. 26.

An anode 100 includes a terminal, section 110 to which an external drive circuit is connected, and a region (electrode region) 130, which contacts an organic layer. A region adjacent to the electrode region 130 in the organic layer becomes a region (luminous region) which a current is flowed in and emits light.

In order to eliminate problems such as brightness unevenness in the luminous region of the organic electroluminescence device with this structure, resistances from a point P0, at which the terminal section 110 contacts to the electrode region 130, on an electrode region 130 to respective points on the electrode region 130, for example, P1 to P2 must be equal.

Nevertheless, the volume resistivity of ITO is not such a small value that it can be ignored when the resistances of respective current paths in the organic electroluminescence device is considered. Hence, a resistance is small in a path, in which the distance of passing through ITO is short, such as the current path between P0 and P1, P2, or P3, and a resistance becomes large in a path, in which the distance of passing through ITO is long, such as the current path between P0 and P4, P5, or P6. Hence, the magnitude of a current which flows through the organic layer differs by a path, that is, a position in the luminous region, and as a result, brightness unevenness and the like arise.

FIG. 27 shows an organic electroluminescence device in which an anode a cathode are formed of ITO. In this figure, a continuous line shows the anode, and a doted line shows the cathode. A cathode 300 includes a terminal section 310 to which an external drive circuit is connected, and a region (electrode region) 330, which connects an organic layer.

In this organic electroluminescence device, since both electrodes are formed of ITO, both of the resistivity of the anode and the resistivity of the cathode cannot be ignored when the resistance difference between the above-mentioned respective paths is considered.

In this structure, the resistance of the path of passing through a path (minimum distance) L1 connecting the terminal sections 110 and 310 with a straight line becomes the smallest. Hence, the current, which flows in the organic layer on the path L1, becomes the largest and the current, which flows in the organic layer, becomes small as a path is apart from the path L1. As a result, brightness unevenness and the like arise.

Various types of prior art are proposed as prior art, which cancels brightness unevenness. For example, an electroluminescence device is also proposed, the device which includes a luminescent layer which is provided between first and second electrodes, and has a luminous region which emits light in the luminance corresponding to a voltage between the above described first and second electrodes and its thickness, the above-mentioned luminescent layer which has the thickness of differing in a layer thickness direction so that the luminance of the luminous region may become uniform (for example, see Japanese Patent Laid-Open No. 11-40362 publication). The above-mentioned first electrode has a first terminal for applying a voltage, and the second electrode is provided with facing the first electrode, has a second terminal for applying a voltage, and exhibits a sheet resistance lower than that of the above mentioned first electrode.

SUMMARY OF THE INVENTION

An object of the present invention is to lessen the difference of magnitude between currents flowing at respective positions in a luminous region in an organic electroluminescence device. Thus, it is to lessen the difference of resistances between respective currant paths, which exist in the organic electroluminescence device innumerably.

To achieve the above-mentioned objective, the present invention provides an organic electroluminescent device. The device includes a final electrode, a second electrode that is formed of a material the volume resistivity of which is equal to or higher than the volume resistivity of the first electrode, and an organic layer between the first electrode and the second electrode. The second electrode includes a substantially rectangular electrode region that contacts the organic layer, a terminal section to which an external drive circuit is connected, wherein the terminal section is located in a predetermined position along the outer periphery of the electrode region, and a conductive section that electrically connects the terminal section to the electrode region. The conductive section includes a first joint connected to the terminal section, a second joint connected to the outer periphery of the electrode region, and a conductive section main body that extends between the first joint and the second joint to electrically connect the first joint to the second joint.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 4(a) to 4(c) are top views for explaining a production method of the organic EL device shown in FIG. 1;

FIG. 9 is a top view of an anode of another modified example;

FIG. 10 is a schematic top view of an anode of a modified example having a highly resistive section;

FIG. 11 is a schematic top view of an anode of a modified example having a highly resistive section;

FIGS 12(a) to 12(c) each is a schematic top view of an anode of a modified example where a conductive section differs;

FIG. 24 is a schematic top view showing dimensions of an electrode region, a terminal section, etc. of an anode;

FIG. 25(a) is a schematic diagram showing luminance measurement points of an example 1;

FIG. 25(b) is a schematic diagram showing luminance measurement points of an example 2;

FIG. 25(c) is a schematic diagram showing luminance measurement points of a comparative example;

DETAILED DESCRIPTION OF THE PREFERRED EMBODIMENTS

Hereinafter, an organic electroluminescence device (hereinafter, this is described as an organic EL device), which embodied the present invention will be explained in detail. First, a first organic EL device will be explained. The first organic EL device, which relates to the present invention has the following features.

One electrode (in this example, an anode) is formed of a material whose volume resistivity is higher than that of another electrode (in this example, a cathode). In other words, when the cathode is a first electrode and the anode is a second electrode, the second electrode is formed of a material the volume resistivity of which is higher than the volume resistivity of the first electrode.

An organic layer exists between the anode and cathode.

The anode has at least an electrode region, which contacts an organic layer, a terminal section to which an external drive circuit is connected, and a conductive section.

The electrode region of the anode is substantially rectangular.

The terminal section is located in a position along the outer periphery of the electrode region of the anode, and electrically connected to the electrode region of the anode through the conductive section of the anode.

The conductive section of the anode includes a joint connected to the terminal section of the anode, a joint connected to the electrode region of the anode, and a main body of the conductive section which electrically connects both joints and does not electrically connect the electrode region and terminal section of the anode.

The joint connected to the electrode region of the anode is connected to the electrode region of the anode in a portion other than a portion, which faces the terminal section in the outer periphery of the electrode region of the anode.

Hereinafter, the structure, a production example, actions, and advantages of the first organic EL device will be explained in detail with referring to figures.

<Structure>

Figure 1:
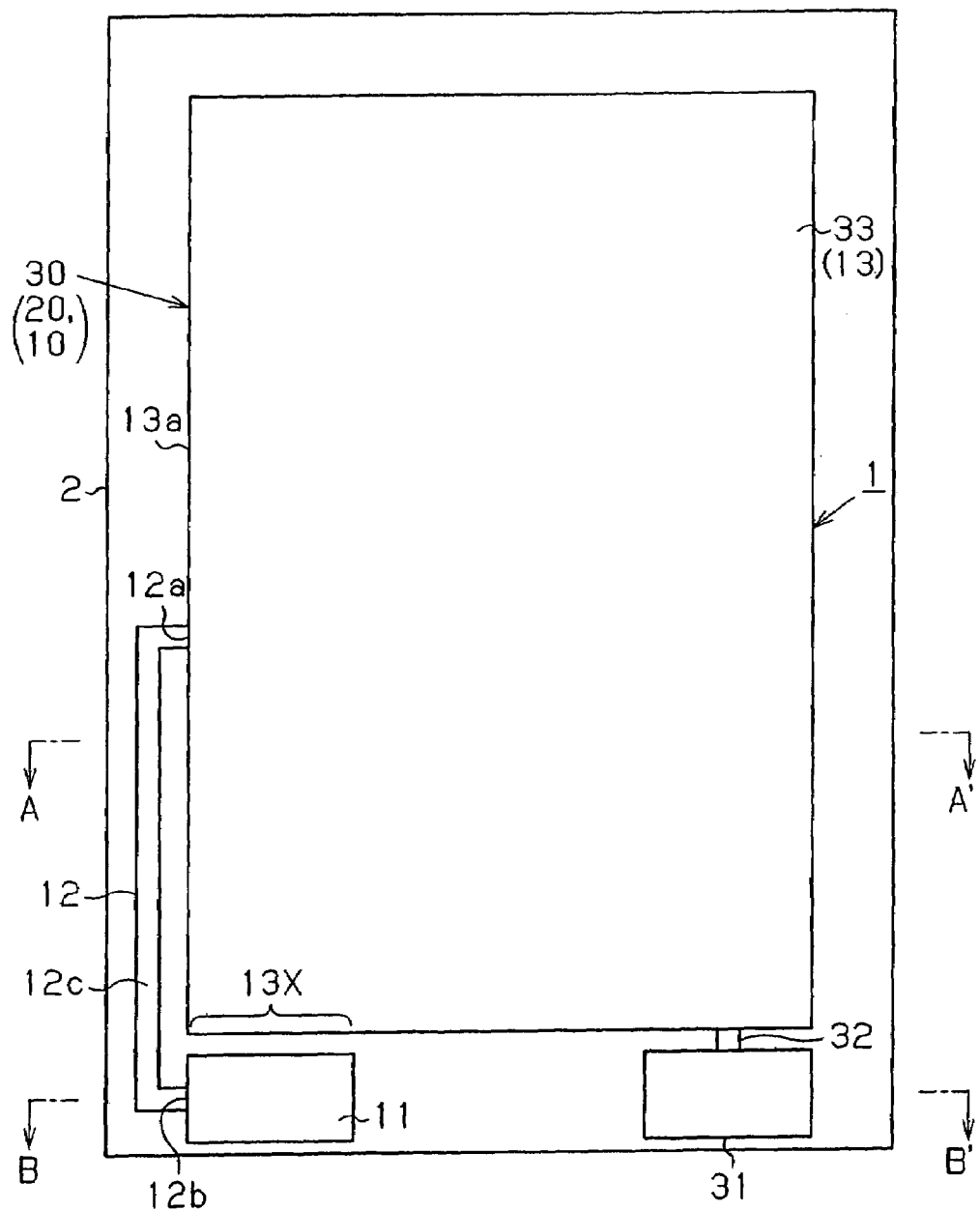
FIG. 1 is a top view of a first organic EL device, which embodied the present invention.
Figure 2:
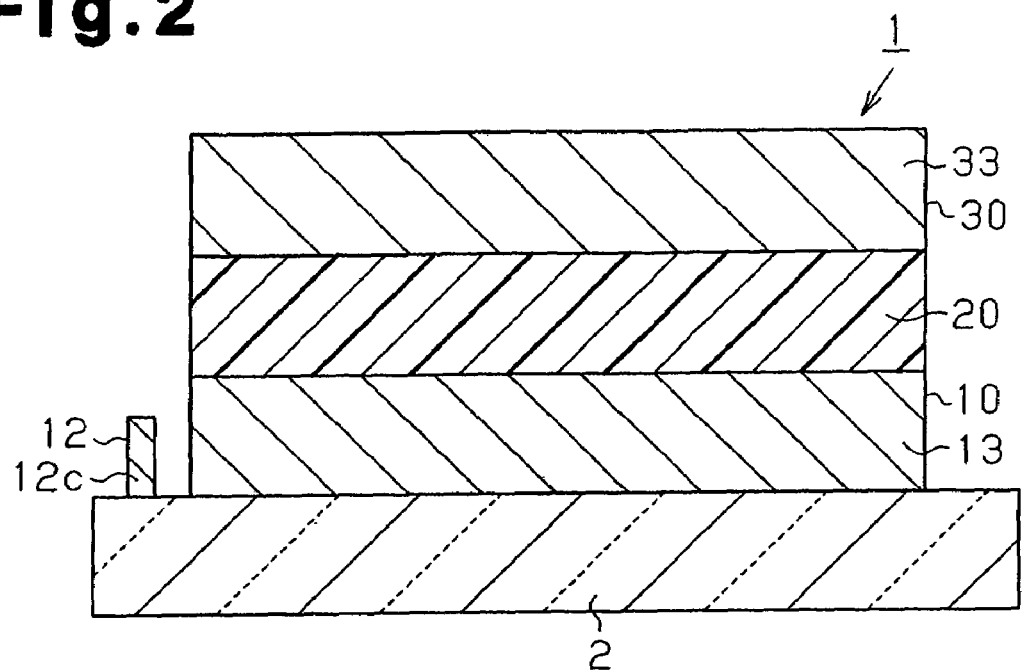
FIG. 2 is a sectional view taken on line A–A' in FIG. 1.
Figure 3:
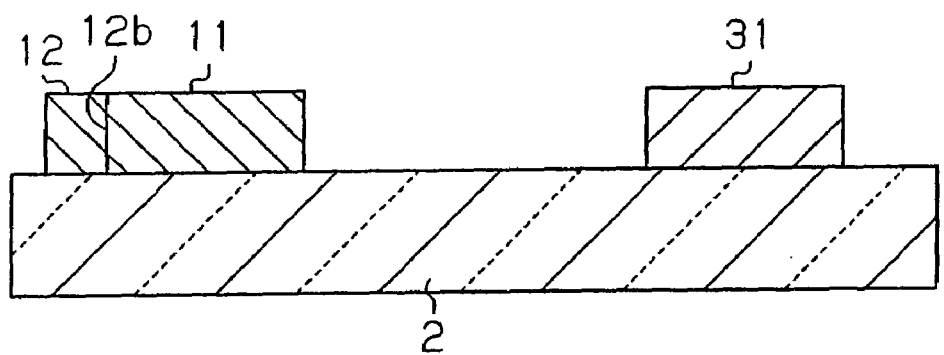
FIG. 3 is a sectional view taken on line B–B' in FIG. 1.

As shown in FIGS. 1 to 3, the first organic EL device 1 is formed on a substrate 2. As shown in FIG. 2, the first organic EL device 1 has an anode 10 as one electrode, an organic layer 20, and a cathode 30 as another electrode. Hereinafter, each component, which constitutes the first organic EL device 1, will be explained.

(Anode 10)

The anode 10 has a terminal section 11 of the anode, a conductive section 12 of the anode, and an electrode region 13 of the anode, and each is formed on the substrate 2. The terminal section 11 of the anode, the conductive section 12 of the anode, and the electrode region 13 of the anode are formed in one piece with a material whose volume resistivity is higher than that of the cathode 30 (at least electrode region 33 of the cathode). That is, the cathode 30 functions as a first electrode and the anode 10 functions as a second electrode that is formed of a material the volume resistivity of which is higher than the volume resistivity of the first electrode.

The terminal section 11 of the anode is provided in a position along the outer periphery of the electrode region 13 of the anode as shown in FIG. 1, and is connected to an external drive circuit which is not shown. It is not necessary to connect with the external drive circuit over the entire terminal section 11 of the anode, but a part of the section may be also connected to the external drive circuit. The terminal section 11 of the anode is not directly connected to the electrode region 13 of the anode. That is, the electrode region 13 or the anode and the terminal section 11 of the anode are separately located on the substrate 2 lest a current should directly flow into the electrode region 13 of the anode from the terminal section 11 of the anode.

The conductive section 12 of the anode electrically connects the terminal section 11 of the anode, and the electrode region 13 of the anode. More specifically, as shown in FIG. 1, a first joint 12b, which is one end at the conductive section 12, connects with the terminal section 11 of the anode, and a second joint 12a, which is another end of the conductive section 12, connects with the electrode region 13 of the anode. Portions of the conductive section 12 except joints 12a and 12b do not connect with the terminal section 11 of the anode, and the electrode region 13 of tho anode. A portion between both the joints 12a and 12b of the anode becomes a main body 12c of the conductive section 12. That is, the main body 12c of the conductive section 12 does not connect electrically with the electrode region 13 and terminal section 11 of the anode.

A position where the conductive section 12 of the anode, and the electrode region 13 of the anode connect, that is, a position of the second joint 12a is a position 13a along the outer periphery of the electrode region 13 of the anode, and a position other than a portion 13x where the electrode region 13 of the anode faces the terminal section 11 of the anode. In other words, the portion 13x is a "facing portion". The second joint 12a is connected to the electrode region 13 at the "non-facing portion".

The electrode region 13 of the anode is a region of contacting the organic layer 20 as shown in FIG. 2. When making the device emit light, positive holes are transported from the external drive circuit connected to the terminal section 11 of the anode through the conductive section 12 of the anode, and the electrode region 13 injects these positive holes into the organic layer 20.

What is necessary as a material for forming the anode 10 is just a material which gives the above-mentioned property to the anode 10, and generally, a known material such as metal, an alloy, an electrically conductive compound, or a mixture of those is selected, which is produced so that a work function of a face (surface) which contacts with the organic layer 20 of the electrode region 13 of the anode may become 4 eV or more.

As the material for forming the anode 10, the followings can be cited, for example. They are metal oxides and metal nitrides such as ITO (indium-tin-oxide), IZO (indium-zinc-oxide), a tin oxide, a zinc oxide, a zinc aluminum oxide, and a titanium nitride, metals such as gold, platinum, silver, copper, aluminum, nickel, cobalt, lead, chromium, molybdenum, tungsten, tantalum, and niobium; alloys of these metals and alloys of copper iodide; conductive polymers such as poly aniline, poly thiophene, pyrrole, polyphenylene vinylene, poly (3-methylthiophene), and polyphenylene sulfide.

When provided in an optical output side rather than the organic layer 20, the anodes 10 is set so that a transmittance to the light to he outputted may generally become larger than 10%. When the light in a visible light region is outputted, ITO with a high transmittance in the visible light region is suitably used.

When the anode 10 is used as a reflective electrode, a material, having the capacity of reflecting the light outputted to the external, among the above-mentioned materials is selected suitably, and, generally, metal, an alloy, or a metallic compound is selected.

The anode 10 may be formed of only one kind of material, which is described above, or may be formed by mixing a plurality of materials. In addition, it may be also multiple layer structure, which consists of two or more layers of the same kind of composition of different kinds of composition.

When a resistance of the anode 10 is high, it is good to provide a supporting electrode to lower the resistance. The supporting electrode is an electrode formed of metal, such as copper, chromium, aluminum, titanium, or an aluminum alloy, or a laminated material of these being partially attached adjacently to the anode 10.

Depending also on a material to be used, the film thickness of the anode 10 is selected generally in a range of about 5 nm to 1 μm, preferably in a range of about 10 nm to 1 μm, more preferably in a range of about 10 nm to 500 nm, especially preferably in a range of about 10 nm to 300 nm, and desirably in a range of 10 nm to 200 nm.

The anode 10 is formed by a publicly known thin-film forming method, which as a sputtering method, an ion plating method, a vacuum deposition method, a spin coating method, or an electron beam evaporation method, by using such materials as are described above.

In addition, it is also good to perform the UV ozone clearing or plasma clearing of its surface.

In order to suppress the occurrence of a short circuit or a defect of an organic EL device, it is good to control surface roughness to 20 nm or less as a mean squared value by a method of micrifying particle size, or a method of grinding after deposition.

(Organic Layer 20)

The organic layer 20 can be produced by a publicly known production method since it is sufficient to adopt publicly known layer structure and layers made of publicly known materials in a publicly known organic electroluminescence device.

That is, it is sufficient that the organic layer 20 just achieves at least the following functions. It is also good to make the layer laminated structure, and to make each layer bear one of functions, or it is also good to achieve the following functions by a single layer.

Electron Injection Function

A function of electrons beings injected from an electrode (cathode). Electron injection property.

Positive Hole Injection Function

A function of positive holes being injected from an electrode (anode). Positive hole injection property.

Carrier Transport Function

A function of carrying at least either electrons or positive holes. Carrier transportability.

The function of carrying electrons is called an electronic transport function (electronic transportability), and the function of carrying positive holes is called a positive hole transport function (positive hole transportability).

Luminescence Function

A function of generating excitons (being in an excitation state) by recombining electrons and carriers, which are injected and transported, and emitting light wheel returning to a ground state.

Hence, in the organic layer 20, a region (luminous region) sandwiched with a face adjacent to the electrode region 13 of the anode and a face adjacent to the electrode region 33 or the cathode emits light by the above-mentioned function.

The organic layer 20 may be constituted by providing layers, for example, a positive hole transportation layer, a luminescent layer, and an electron transportation layer in order from the anode side.

The positive hole transportation layer is a layer, which transports positive holes to the luminescent layer from the anode. As a material for forming the positive hole transportation layer, it is possible to select one from among, for example, metal phthalocyanines such as copper phthalocyanine and tetra (t-butyl) copper phthalocyanine, and non-metal phthalocyanines, low molecule materials such as aromatic amines such as a quinacridone compound, 1,1-bis (4-di p tolyl amino phenyl) cyclohexane, N,N'-diphenyl-N, N'-bis (3-methyl phenyl)-1,1'-biphenyl 4,4'-diamine, N,N'-di (1-naphthyl)-N,N'-diphenyl-1,1'-biphenyl-4,4'-diamine, polymeric materials such as poly thiophane and poly aniline, a poly thiophene oligomer material, and other existing hole transportation materials.

The luminescent layer is a layer which becomes in an excitation state by making positive holes, transported from an anode side, and electrons transported from a cathode side recombined, and which emits light when returning from the excitation state to a ground state. As a material of the luminescent layer, a fluorescent material and a phosphorescence material are adoptable. In addition, a dopant (a fluorescent material or a phosphorescence material may be contained in a host material.

As a material for forming the luminescent layer, it is possible to use one from among, for example, low molecule materials such as a 9,10-diarylanthracene derivative, a pyrene derivative, a coronene derivative, a perylene derivative, a rubrene derivative, 1,1,4,4-tetra-phenyl butadiene, a tris (8-quinolate) aluminum complex, a tris (4-methyl-8-quinolate) aluminum complex, a bis (8-quinolate) zinc complex, a tris (4-methyl-5-trifluoro methyl-8 quinolate) aluminum complex, a tris (4-methyl-5-cyano-8-quinolate) aluminum complex, a bis (2-methyl-5-trifluoro methyl-H-quinolate) [4-(4-cyanophenyl) phenolate]aluminum complex, a bis (2-methyl-5-cyano-8-quinolate) [4-(4-cyanophenyl) phenolate]aluminum complex, a tris (8-quinolate) scandium complex, a bis [8-(para-tosyl) amino quinoline] zinc complex or cadmium complex, 1, 2, 3, 4 tetraphenyl cyclopentadiene, pentaphenyl cyclopentadiene, polly-2,5-diheptyloxy para-phenylene vinylene, a coumarin system fluorescent substance, a perylene system fluorescent substance, a pyran system fluorescent substance, an anthrone system fluorescent substance, a porphyrin system fluorescent substance, a quinacridone system fluorescent substance, an N,N'-dialkyl-substituted-quinacridone system fluorescent substance, a naphthalimido system fluorescent substance, and an N,N'-diaryl-substituted-pyrrolopyrrole system fluorescent substance, polymeric materials such as polyfluorene, polyparaphenylenevinylene, and polythlophene, and other existing luminescent materials. When host/guest type structure is adopted, what is necessary is just to select a host and a guest (dopant) suitably from these materials.

The electron transportation layer is a layer which transports electrons to the luminescent layer from the cathode. What are cited as material for forming the electron transportation layer includes, for example, 2-(4-biphenylyl)-5-(4-t-butyl phenyl)-1,3,4-oxadiazolo, 2 and 5-bis (1 naphthyl)-1,3,4-oxadiazole, an oxadiazole derivative, a bis (10-hydroxybenzo [h] quinolate) beryllium complex, a triazole compound, and the like.

Naturally, it is also possible to provide layers, which are adopted as a publicly known organic electroluminescence layer, such as a buffer layer, a positive hole block layer, an electron injection layer, and a positive hole injection layer, in the organic layer 20. It is also possible to provide these layers by a publicly known production method by using a publicly known material.

(Cathode 30)

As shown in FIGS. 1 to 3, the cathode 30 has a terminal section 31 of the cathode, a conductive section 32 of the cathode, and an electrode region 33 of the cathode, and these components are integrally formed.

The terminal section 31 of the cathode is provided in a position along the outer periphery of the electrode region 33 of the cathode, and is connected to an external drive circuit, which is not shown. It is not necessary to connect with the external drive circuit over the entire terminal section 31 of the cathode, but a part of the section may be also connected to the external drive circuit. As shown in FIG. 3, the terminal section 31 of the cathode may be also provided on the substrate 2.

The conductive section 32 of the cathode is a conductive path, which connects electrically the terminal section 31 or the cathode, and the electrode region 33 of the cathode.

The electrode region 33 of the cathode is stacked on a face of the organic layer 20 which is oppose to a face which contacts to the electrode region 13 of the anode. When a device is made to emit light, electrons are transported from the external drive circuit connected to the terminal section 31 of the cathode through the conductive section 32 of the cathode, and these electrons are injected into the organic layer 20.

Since the cathode 30 has volume resistivity smaller than the anode 10, a connecting location of the conductive section 32 and the electrode region 33 of the cathode is not limited especially. In addition, the conductive section 32 of the cathode may not be provided, but the terminal section 31 of the cathode and the electrode region 33 of the cathode may be also connected directly.

The cathode 30 is an electrode, which injects electrons into the organic layer 20 (in the above-mentioned layer structure, the electron transportation layer). In order to make electron injection efficiency high, metal, an alloy, electrically conductive compounds, and mixtures of those each of which has a work function which is for example, less than 4.5 eV, generally is 4.0 eV or less, or typically is 3.7 eV or less can be adopted on an electrode material.

What are cited as the above mentioned electrode materials are, for example, lithium, sodium, magnesium, gold, silver, copper, aluminum, indium, calcium, tin, ruthenium, titanium, manganese, chromium, yttrium, an aluminum-calcium alloy, an aluminum-lithium alloy, an aluminum magnesium alloy, a magnesium-silver alloy, a magnesium-indium alloy, a lithium-indium alloy, a sodium-potassium alloy, a magnesium/copper mixture, an aluminum/aluminum oxide mixture, and the like. In addition, it is possible to use the materials adoptable as materials used for the anode.

When provided in the optical output side rather than the luminescent layer, the cathode 30 is set so that the transmittance to light to be outputted may generally become larger than 10%. For example, an electrode or the like which is formed by stacking a transparent conductive oxide on a super-thin magnesium-silver alloy film is adopted. Furthermore, in this cathode, so as to prevent the luminescent layer etc. from damaging by plasma at the time of the sputtering of conductive oxide, it is good to provide a buffer layer, to which copper phthalocyanine or the like are added, between the cathode 30 and organic layer 20.

When the cathode 30 is used as a reflective electrode, a material, having the capacity of reflecting the light outputted to the external, among the above-mentioned materials is selected suitably, and, generally, metal, an alloy or a metallic compound is selected.

The cathode 30 may be formed with the above-mentioned material independently, or may be formed with a plurality of materials. For example, when adding 5% to 10% of silver and copper to magnesium, it is possible to prevent the oxidation of the cathode 30, and also to enhance adhesiveness with the organic layer 20 of the cathode 30.

In addition, the cathode 30 may have also multiple layer structure, which consists of two or more layers of the same kind of composition or different kinds of composition. For example, the following structure may be also adopted.

In order to prevent the oxidation of the cathode 30, a protective layer made of corrosive resistant metal is provided in a portion, which does not contact to the organic layer 20 of the cathode 30.

As a material for forming this protection layer, silver, aluminum, or the like is used preferably.

In order to make a work function of the cathode 30 small, oxide, fluoride, a metallic compound, or the like which has a small work function is inserted into an interface portion between the cathode 30 and organic layer 20.

For example, it may be also usable structure to make a material of the cathode 30 aluminum and to insert lithium fluoride or lithium oxide in its interface portion.

The cathode 30 can be formed by a publicly known thin film forming method such as a vacuum deposition, an ion sputtering method, ionization vacuum deposition, an ion plating method, or an electron beam evaporation method.

(Substrate 2)

A substrate 2 is a mainly plate-like member supporting the organic EL device 1. The organic EL device 1 is generally produced as an organic EL device supported by the substrate 2 since each layer to constitute the device 1 is very thin.

Since the substrate 2 is a member on which the organic EL device 1 is stacked, it is preferable to have plane smoothness.

In addition, the substrate 2 is made transparent to the light to be outputted when being in the optical output side rather than the organic layer 20.

A publicly known object can be used so long as it has the above-mentioned performance as the substrate 2. Generally, a glass substrate, a silicon substrate, a ceramic board such as a quartz substrate, or a plastic substrate is selected. In addition, a substrate made by a metallic foil formed on a metal substrate or a supporting member is also used. Furthermore, it is also possible to use a substrate comprising a compound sheet made by combining two or more substrates, which are the same kind or different kinds.

PRODUCTION EXAMPLES

A first organic EL device 1 is producible by suitably combining publicly known organic EL device production methods such as the above-mentioned production methods, and, for example, it can be also produced as shown in FIG. 4.

Production Example 1

On one face of the substrate 2, an ITO layer 40 as a material for forming the anode 10 is provided. At this time, as shown in FIG. 4(*a*), the ITO layer 40 is provided so as to include a range where at least the terminal section 11 of the anode, and the conductive section 12 and electrode region 13 of the anode are arranged. As a method of providing the ITO layer 40 on the substrate 2, it is possible to suitably adopt a method from among the publicly known methods, which are described above. For example, it is possible to adopt the sputtering method, the vacuum deposition method, sol-gel process, cluster beam vacuum deposition, a PLD method, or the like.

Next, as shown in FIG. 4(b), a portion of the ITO layer 40 which is other than the terminal section 11 of the anode, and the conductive section 12 and electrode region 13 of the anode is removed from the substrate 2 on which the ITO layer 40 is provided. What are cited as removal methods are a physically removing method such as grinding, a method of masking a portion which is not removed and removing portions, which are removed, by dry etching or wet etching.

The organic layer 20 is stacked on the electrode region 13, which is produced as described above. What is necessary as this stacking method is just to stack an adequate material according to the layer structure, which is adopted, by using one of the publicly-known thin forming methods which are described above.

As shown in FIG. 4(c), the electrode region 33 of the cathode is provided on the organic layer 20, the terminal section 31 of the cathode is provided on the substrate, and the electrode region 33 of the cathode and the terminal section 31 of the cathode are provided so as to be connected by the conductive section 32 of the cathode. What is necessary for providing this cathode 30 is to suitably adopt one of the publicly known cathode production methods, which are mentioned above.

In addition, the first organic EL device 1 is also producible as follows.

Production Example 2

First, a portion, where the anode 10 is not formed on one face of the substrate 2 is masked. Then, the ITO layer 40 is provided on this face of the substrate, and, subsequently the mask is removed. Thus, after producing then anode 10, the organic layer 20 and cathode 30 are formed similarly as described above.

Next, actions of the first organic EL device 1 will be explained.

<Actions>

When the external drive circuit is connected to the terminal section 11 of the anode and the terminal section 31 of the cathode of the first organic EL, device 1, positive holes are transported to the electrode region 13 of the anode through the conductive section 12 of the anode from the terminal section 11 of the anode. On the other hand, electrons are transported to the electrode region 33 of the cathode through the conductive section 32 of the cathode from the terminal section 31 of the cathode.

The positive holes are injected into the organic layer 20 from the electrode region 13 of the anode, and the electrons are injected into it from the electrode region 33 of the cathode. Then, at least either of the positive holes or the electrons are transported, both are recombined, an excitation state is generated, and a luminescent material is made an excitation state. When the luminescent material returns to the ground state, it emits light.

Next, advantages of the first organic EL device 1 will be explained.

<Advantages>

The first organic EL device 1 can make the difference of the magnitude between currents flowing in respective positions in a luminous region of the organic layer small. Thus, it is possible to lessen the maximum difference between resistances of respective current paths, which innumerably exist in the organic EL device 1.

Since it is possible to ignore the cathode 30 with small volume resistivity when this advantage is considered, the above-mentioned advantage will be explained in detail by using FIG. 5(a) having shown only the substrate 2 and anode 10.

Figure 5A:
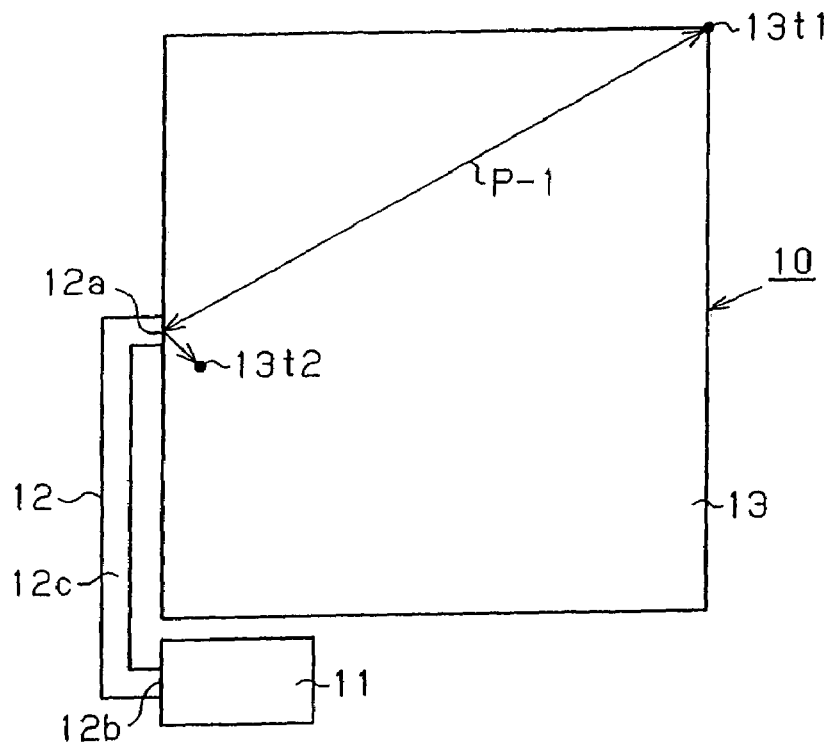
FIG. 5(a) is a top view of an anode of the organic EL device shown in FIG. 1.
Figure 5B:
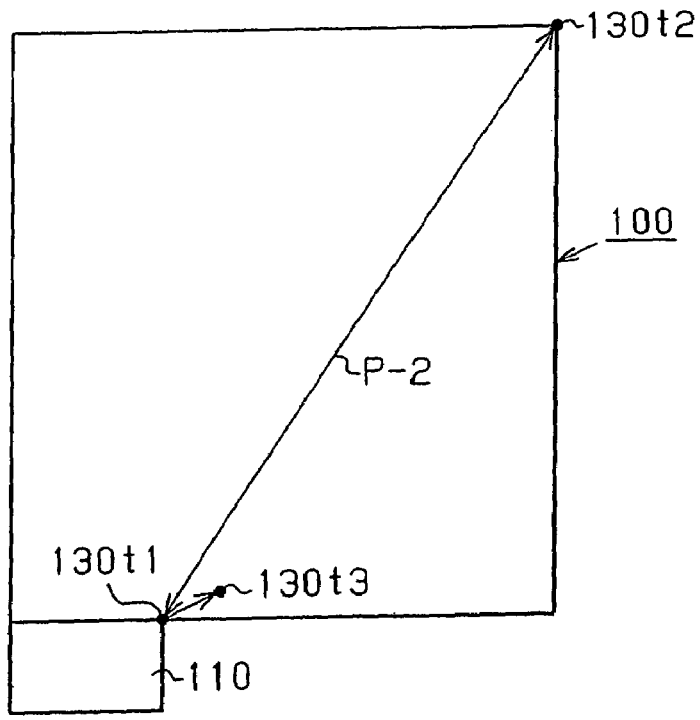
FIG. 5(b) is a top view of an anode of a conventional organic EL device.

FIG. 5(a) shows the anode 10 of the first organic EL device 1, and FIG. 5(b) shows an anode 100 of a conventional organic EL device. As for the conventional organic EL device, the terminal section 110 of the anode and the electrode region 130 of the anode is directly connected electrically. The electrode region 13 of the anode shown in FIG. 5(a) and the electrode region 130 of the anode shown in FIG. 5(b) are made of a material with the same volume resistivity, and have the same film thickness, and the same dimensions (surface area).

A path with the largest resistance in the first organic EL device 1 is a path arriving at a point $13t1$ in the edge of the electrode region 13 of the anode from a second joint $12a$ of the anode, as shown in FIG. 5(a). The point $13t1$ is a point that is the most distant from the second joint $12a$.

On the other hand, a path with the smallest resistance in the first organic EL device 1 is a path, which is shown in FIG. 5(a) and arrives at a point $13t2$ near the second joint $12a$ from the second joint $12a$ of the anode.

The difference between resistances of both paths becomes large as the differences between distances from the second joint $12a$ to the points $13t1$ and $13t2$ becomes large. Here, since the distance from the second joint $12a$ to the point $13t2$ is zero mostly, it is conceivable that the latter's resistance is mostly zero.

That is, the maximum difference among resistances in the first organic EL device 1 is determined by the length of a straight line P-1 that connects the second joint $12a$ and point $13t1$.

A path with the largest resistance in the conventional organic EL device is a path arriving at a point $130t2$ at a position, which is the most distant from the contact point $130t1$, from the contact point $130t1$ of the terminal section 110 of the anode and the electrode region 130 of the anode, as shown in FIG. 5(b). In addition, a path with the smallest resistance in the conventional organic EL device is a path, which is shown in FIG. 5(b) and arrives at a point $130t3$ near the contact point $130t1$ from the contact point $130t1$.

The difference between resistances of both paths becomes large as the differences between distances from the contact point $130t1$ to the points $130t2$ and $130t3$ becomes large. Here, since the distance from the contact point $130t1$ to the contact point $130t3$ is zero mostly, it is conceivable that the letter's resistance is mostly zero.

That is, the maximum difference among resistances in the conventional organic EL device is determined by the length of a straight line P-2 that connects the contact point $130t1$ and contact point $130t2$.

As described above, since the electrode region 13 of the anode in the first organic EL device 1, and the electrode region 130 of the anode in the conventional organic EL device are produced in the same conditions as described above, the difference between the maximum differences of both resistances becomes large as the difference between the lengths of the straight line P-1 and straight line P-2 becomes large.

Here, the straight line P-2 is almost a diagonal line of the electrode region 130 of the rectangular anode. Hence, it can be said that the straight line P-1 is shorter than the straight line P-2.

Clearly from the above explanation, the maximum difference between the resistances in the first organic EL device 1 can be made smaller than the maximum difference between the resistances in the conventional organic EL device.

In addition, in the first organic EL device 1, when setting suitably a position, which the conductive section 12 connects with the electrode region 13 of the anode, it also becomes possible to make the maximum difference between resistances smaller.

Since the first organic EL device 1 exhibits the above advantages, it also becomes possible to obtain the following advantages.

(Advantage a) Suppression of Brightness Unevenness

In the first organic EL device 1, the difference between the resistances of current paths can be made smaller than the conventional, as described above. Hence, in the organic layer 20, it is possible to make the difference of the current value between a location through which a rich current flows and a location through which a poor current flows smaller than the conventional. Therefore, it becomes possible to make brightness unevenness small as the entire device.

The width of the conductive section 12 is less than the width of the terminal section 11. In comparison to this, the terminal section of the prior art is connected to an entire portion in the outer periphery of the electrode region that faces the terminal section. That is, unlike the prior art, a portion of the electrode region 13 that is close to the terminal section 11 in the current path from the terminal section 11 to the electrode region 13, or a portion of the electrode region 13 that first receives the current from the terminal section 11, is limited to a portion of the electrode region 13 that is connected to the second joint 12a in this embodiment. Therefore, since a more uniform current is supplied to most part of the electrode region 13, brightness unevenness of the organic EL device is suppressed.

(Advantage b) Achievement of Long Lifetime of Device

As described above, the first organic EL device 1 can make the difference of the current value between a location through which a rich current flows and a location through which a poor current flows smaller than the conventional in the organic layer 20. Therefore, it also becomes possible to lessen the lifetime difference between the location where the lifetime of the device becomes long, and the location where the lifetime becomes short, the lifetime difference, which is caused by amounts of currents.

(Advantage c) Prevention of Deterioration of Device

As described above, the first organic EL device 1 can make the difference of the current value between a location through which a rich current flows and a location through which a poor current flows smaller than the conventional in the organic layer 20. Therefore, it also becomes possible to lessen the difference of deterioration between the location where the device is easy to deteriorate, and the location where the device is hard to deteriorate, the difference of deterioration, which is caused by amounts of currents.

(Advantage d) Suppression of Chromaticity Unevenness

For example, it is possible to suppress the chromaticity unevenness in an organic EL device which emits the light with a plurality of wavelengths by making an organic layer contain a plurality of luminescent materials, the organic layer which expresses white by stacking a layer (red light layer) which emits red light, a layer (blue light layer) which emits blue light, and a layer (green luminescent layer) which emits green light. In such an organic EL device, when the amplitude of the current, which flows into an organic layer, changes, luminance changes for every luminescent material. Thus, the luminescent color (chromaticity) as a device changes. (the S-S annihilation phenomenon, and T-T annihilation phenomenon).

Nevertheless, as described above, the first organic EL device 1 can make the difference of the current value between a location through which a rich current flows and a location through which a poor current flows smaller than the conventional in the organic layer 20. Hence, it becomes possible to suppress the above phenomena. Thus, it becomes possible to suppress the chromaticity unevenness.

MODIFIED EXAMPLES

In addition, the first organic EL device 1 can be also modified as follows. In addition, it is also possible to embody the combination of respective modified examples within limits where they are not mutually contradictory.

Modified Example 1

The conductive section 12 of the anode may not be arranged along one side of the electrode region 13 of the anode as shown in FIG. 1 and the like, but may be arranged along a plurality of sides.

Figure 6A:
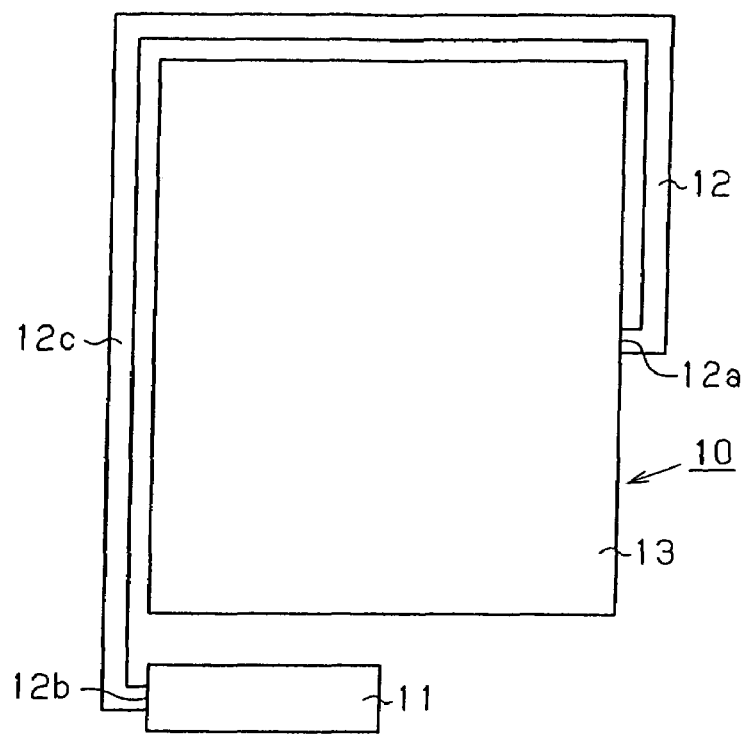
FIGS. 6(a) and 6(b) each is a schematic top view of an anode of a modified example where a conductive section differs.

For example, it may be arranged along three sides as shown in FIG. 6(a).

Figure 6B:
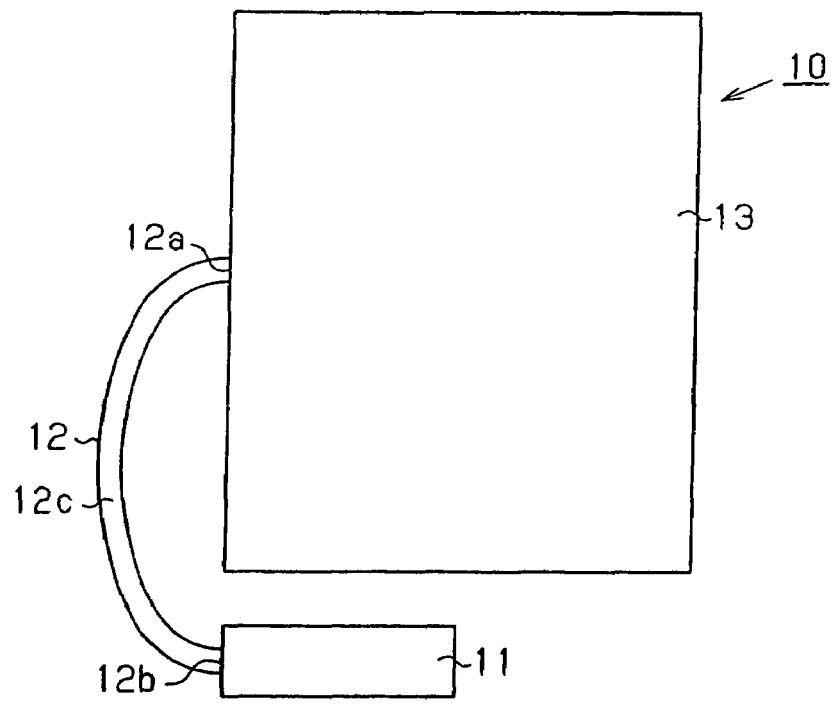

In addition, it is not necessary to provide the conductive section 12 of the anode along with the outer periphery of the electrode region 13 of the anode. For example, as shown in FIG. 6(b), even if the conductive section 12 of the anode does not go along the outer periphery of the electrode region 13 of the anode, it is possible to obtain the above-mentioned actions and advantages.

That is, in regard to the conductive section 12 of the anode in the first organic EL device 1, what is necessary is that at least one joint 12a connects with the electrode region 13 of the anode, and another joint 12b connects with the terminal section 11 of the anode.

Modified Example 2

The number of joints of the conductive section 12 of the anode is not limited to two.

Figure 7A:
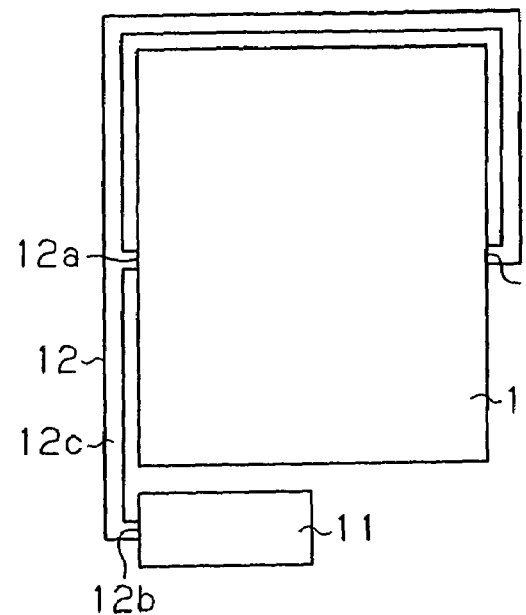
FIGS. 7(a) and 7(b) each is a schematic top view of an anode of a modified example where a condition section differs.

For example, as shown in FIG. 7(a), it is also good to provide two joints (second joint 12a and one more second joint 12a') connected to the electrode region 13 of the anode. In addition, as shown in 7(b), it is also good to provide two joints (first joint 12b and one more first joint 12b') connected to the terminal section 11 of the anode. Naturally, it is also good to provide three or more joints.

Modified Example 3

Figure 8:
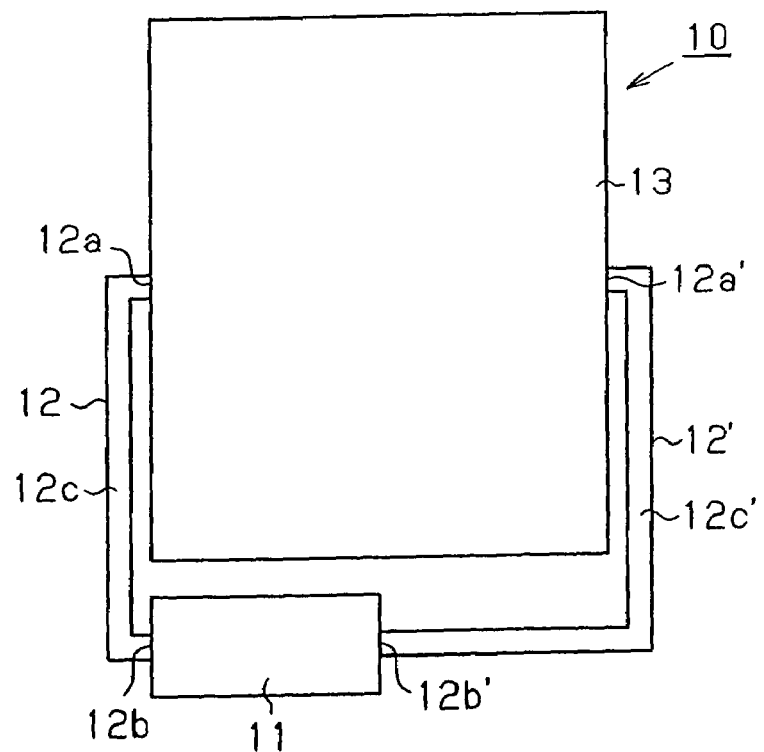
FIG. 8 is a schematic top view of an anode of a modified example where a conductive section differs.

It is also good to provide two or more conductive sections 12 of the anode. For example, as shown in FIG. 8, it is also good to provide two conductive sections (conductive section 12 and conductive section 12') of the anode. Thus, it is also good to provide the conductive sections 12 of the anode whose number is beyond the number of the terminal sections 11 of the anode.

In the modified example 2 or modified example 3, when two or more first joints 12b connected to the electrode region 13 of the anode are provided, at least one of them may be also provided in a part of portion where the electrode region 13 of the anode and the terminal section 11 of the anode face.

For example, as shown in FIG. 9, it is also good to provide two conductive sections of the anode. In this structure, as described above, a first conductive section 12 connects with the electrode region 13 in a portion except a portion where the first conductive section 12 faces the terminal section 11 of the anode in the outer periphery, of the electrode region 13 of the anode. A second conductive section 12' connects with the electrode region 13 in a part of a portion where the second conductive section 12 faces the terminal section 11 of the anode in the outer periphery of the electrode region 13 of the anode.

When the above structure is adopted, the amount of currents, which flow through positions near the terminal section 11 of the anode in the organic layer 20, also increases.

Modified Example 4

When the position, which the conductive section 12 of the anode connects with the electrode region 13 of the anode, is set so that the following condition (i) may be satisfied, the above-mentioned advantages are obtained in a better extent. When it is set so that the following condition (ii) may be satisfied, the above-mentioned advantages are obtained in a further extent.

(i) Any position of outer periphery of electrode region 13 of anode. And a position where the difference between the maximum value and the minimum value of resistances between the above-mentioned position and respective points on the outer periphery of the electrode region is smaller than the difference between the maximum and the minimum of resistances between respective points of the concerned portion to be connected, and respective points on the outer periphery of the electrode region in the case that the electrode region and terminal section are directly connected electrically in the minimum distance.

That is, when the electrode region 13 of the anode is produced in uniform film thickness, uniform density, etc., it is good to set the above-mentioned connecting position so that the straight line P-1 shown in FIG. 5(*a*) may become shorter than the straight line P-2 shown in FIG. 5(*b*).

(ii) Any position of outer peripheries of electrode region 13 of anode. And a position where the maximum of the difference between resistances of current paths, which pass through the inside of the electrode region 13 of the anode and connect the position concerned and the periphery of the electrode region 13 of the anode in a straight line becomes the smallest. Or, the vicinity of this position.

That is, when the electrode region 13 of the anode is produced in uniform film thickness, uniform density, etc., it is good to calculate a position where the length of the straight line which connects the second joint 12*a* of the conductive section 12 of the anode and the periphery of the electrode region 13 of the anode becomes the shortest, as showed in FIG. 5(*a*), and to make this position or the vicinity of this position the connecting position of both.

When this is designed like the above-mentioned modified example 2 or modified example 3 so that the conductive section 12 of the anode may connect with the electrode region 13 of the anode in a plurality of positions, it is good to actually connect all connecting points and to design this so that the difference of the maximum value and minimum value of resistances between one connecting point and the electrode region 13 of the anode may become small, preferably, the smallest. When this position or the vicinity of this position is made each second joint 12*a*, the above-mentioned advantages can be obtained in a better extent.

In addition, in regard to the connecting position of the conductive section 12 of the anode and the electrode region 13 of the anode, it is also good to find out and determine a position, which the brightness unevenness becomes the smallest by, for example, suitably changing this position.

Modified example 5

As shown in FIG. 10, it is also good to provide a high resistance section 14, which is formed of a material whose volume resistivity is higher, then that of the electrode region 13 of the anode, in a region between the electrode region 13 of the anode, and the conductive section 12 of the anode.

In this way, by providing the high resistance section 14, it becomes possible to make a possibility extremely small, the possibility that currents flow into the electrode region 13 of the anode in positions other than the second joint 12*a* of the conductive section 12 of the anode from the conductive section 12 of the anode to the electrode region 13 of the anode. Therefore, it becomes possible to obtain the above-mentioned advantages in a better extent.

It is also not necessary to provide the high resistance section 14 in the entire region between the electrode region 13 of the anode and the conductive section 12 of the anode, but it is also good to provide it only in a part.

In addition, it is also good not to provide the high resistance section 14 along with the outer periphery of the electrode region 13 of the anode, but to provide it aslant against the outer periphery, or to provide it so as to have a curve. That is, what is necessary is just to provide it so that the above-mentioned advantages may be obtained.

As described above, as for the high resistance section 14, any member may be arranged as long as it is a material whose volume resistivity is higher than that of the electrode region 13 of the anode, and this member may be arranged freely. As a specific example of the high resistance section 14, the following can be called, for example.

Like the above-mentioned production example, the high resistance section 14 is producible by removing an electrode material between the electrode region 13 of the anode, and the terminal section 11 of the anode after applying the electrode material. Thus, it is also good to produce the high resistance section 14 by removing a material by using publicly-known removal methods such as polishing and a chemical etching method after applying the material for forming the terminal section 11 of the anode, the conductive section 12 of the anode, and/or the electrode region 13 of the anode in a region in which the high resistance section 14 will be provided.

Since the high resistance section 14 produced in this way becomes a groove (a cavity, a portion where air is located), it becomes a region whose volume resistivity is higher than that of the conductive section 12 of the anode.

In order to prevent the deterioration of the organic layer 20 etc., it is also good to arrange a gas or a material inactive for the organic layer 20 etc., into the groove produced in this way. However, this gas or material needs to be a material whose volume resistivity is higher than that of the electrode region 13 of the anode. In addition, it is preferable that this gas or material does not deteriorate an organic EL device, or that it is a gas or a material, which is hard to deteriorate the organic EL device. Generally, it is possible to adopt a publicly known insulating material used for an organic EL device as shown later in a modified example 11 (see FIGS. 17 to 19). In addition, it is also good to produce an organic EL device so that an insulating layer 4 in the modified example 11 may go into the above-mentioned groove.

It is also good to increase volume resistivity higher than that of the electrode region 13 of the anode by oxidizing an electrode material at a position after applying the electrode material in the position where the high resistance section 14 win be arranged. For example, it is also good to produce the high resistance section 14 by performing the plasma oxidation of this region. In this case, what is necessary is just to oxidize at least a face of the high resistance section 14 facing the terminal section 11 of the anode, and a face facing the electrode region 13 of the anode.

It is also good to arrange the high resistance section 14 made of a material whose volume resistivity is higher than that of the electrode region 13 of the anode beforehand in a position where the high resistance section 14 will be arranged, and to form the anode 10 thereafter.

Modified Example 6

As shown in FIG. 11, it is good to provide a high resistance section (second high resistance section) 15, which is formed of a material whose volume resistivity is higher than that of the conductive section 12 of the anode, in a region between the terminal section 11 of the anode, and the electrode region 13 of the anode.

By providing the high resistance section 15, it becomes possible to make a possibility extremely small, the possibility that currents directly flow into the electrode region 13 of the anode from the terminal section 11 of the anode, and hence, it becomes possible to obtain the above-mentioned advantages in a better extent.

As a production method of the high resistance section 15, it is possible to adopt a method similar to the production method of the high resistance section 14 shown in the modified example 5, Hence, for example, it is also possible to produce the high resistance section 15 by removing an electrode material after providing the electrode material, which is the same as that of the conductive section 12 of the anode, or the electrode region 13 of the anode in a position in which the high resistance section 15 will be provided.

Modified Example 7

The number of the terminal sections 11 of the anode is not limited to one, but may be two or more.

Figure 13:
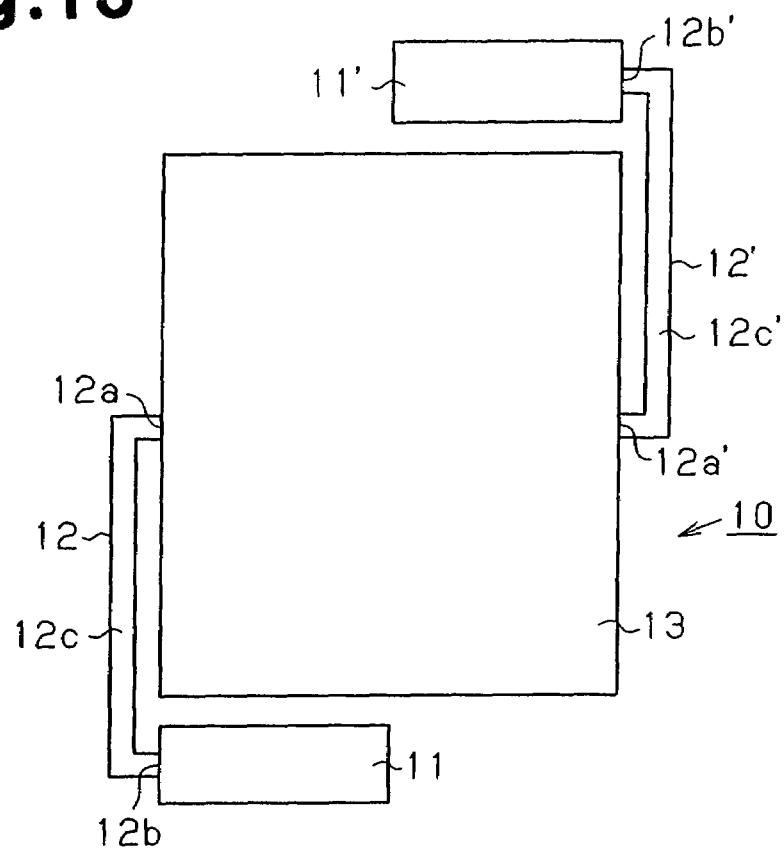
FIG. 13 is a schematic top view of an anode of a modified example where a position of a terminal section differs.

For example, as shown in FIG. 12(*a*), it is also good to provide two terminal sections (a terminal section 11 and a terminal section 11') of the anode in the outside of one side of the electrode region 13 of the anode, and as shown in FIG. 13, it is also good to provide terminal sections 11 and 11' of the anode respectively in outsides of sides of the electrode region 13 of the anode where face each other. When providing the plurality of terminal sections 11 and 11' of the anode in this way, it is also good to provide conductive sections 12 and 12' of the anode in respective terminal sections 11 and 11' of the anode, and to connect the respective conductive sections 12 and 12' of the anode with the electrode region 13 of the anode in positions which are different.

As shown in FIG. 12(*a*), that is, when the anode 10 is provided so as to satisfy the following conditions, it becomes possible to arrange the terminals of the anode in a lump nearby one side or the electrode region 13 of the anode. Hence, it becomes easy to perform the connection and wiring with the external drive circuit. As a result, it also becomes possible to downsize equipment (for example, personal digital assistant etc.). using this organic EL device, or to lessen an area and volume, which the organic EL device in this equipment occupies.

The anode 10 has at least the one electrode region 13 of the anode which contacts to an organic layer, the two terminal sections 11 and 11' of the anode to which an external drive circuit is connected, and the two conductive sections 12 and 12' of the anode.

Respective terminal sections 11 and 11 are connected with the electrode region 13 of the anode electrically through the conductive sections 12 and 12' of the anode, respectively.

The electrode region 13 of the anode is substantially rectangular.

As shown in FIG. 12(*a*), the respective terminal sections 11 and 11' of the anode are arranged in the vicinities of the both ends of one short side 13-1 of the outer periphery of the electrode region 13 of the anode.

As shown in FIG. 12(*a*), the respective conductive sections 12 and 12' of the anode are connected with the electrode region 13 of the anode in different long sides in the outer periphery of the electrode region 13 of the anode, respectively. That is, the conductive section 12 of the anode is electrically connected in the long side 13-2, and the conductive section 12' of the anode is electrically connected in the long side 13-4.

In addition, as shown in FIG. 12(*b*), when the material, thickness, and film thickness of respective conductive sections 12 and 12' are made substantially the same, it is good to make a position of the second joint 12*a*, where the conductive section 12 and the electrode region 13 of the anode are connected, and a position of the second joint 12*a'*, where the conductive section 12' and the electrode region 13 of the anode are connected, in the long sides 13 2, 13 4 of the electrode region 13 of the anode substantially the same. That is, it is good to make a distance L from the short side 13-1 to the second joint 12*a* and a distance L' from the short side 13-1 to the second joint 12*a'* substantially the same. Owing to this, it is possible to obtain the above-mentioned advantages in a better extent, and to extremely lower a possibility that problems such as brightness unevenness arise.

When this is designed so that at least one of the material, thickness, and film thickness of respective conductive sections 12 and 12' may be different, it is good to make the above-mentioned distance L and distance L' differ. At shown in FIG. 12(*c*), when the material and film thickness are the same, and the conductive second 12' is made thicker than the conductive section 12, it is good to make the distance L' longer than the distance L.

Figure 17:
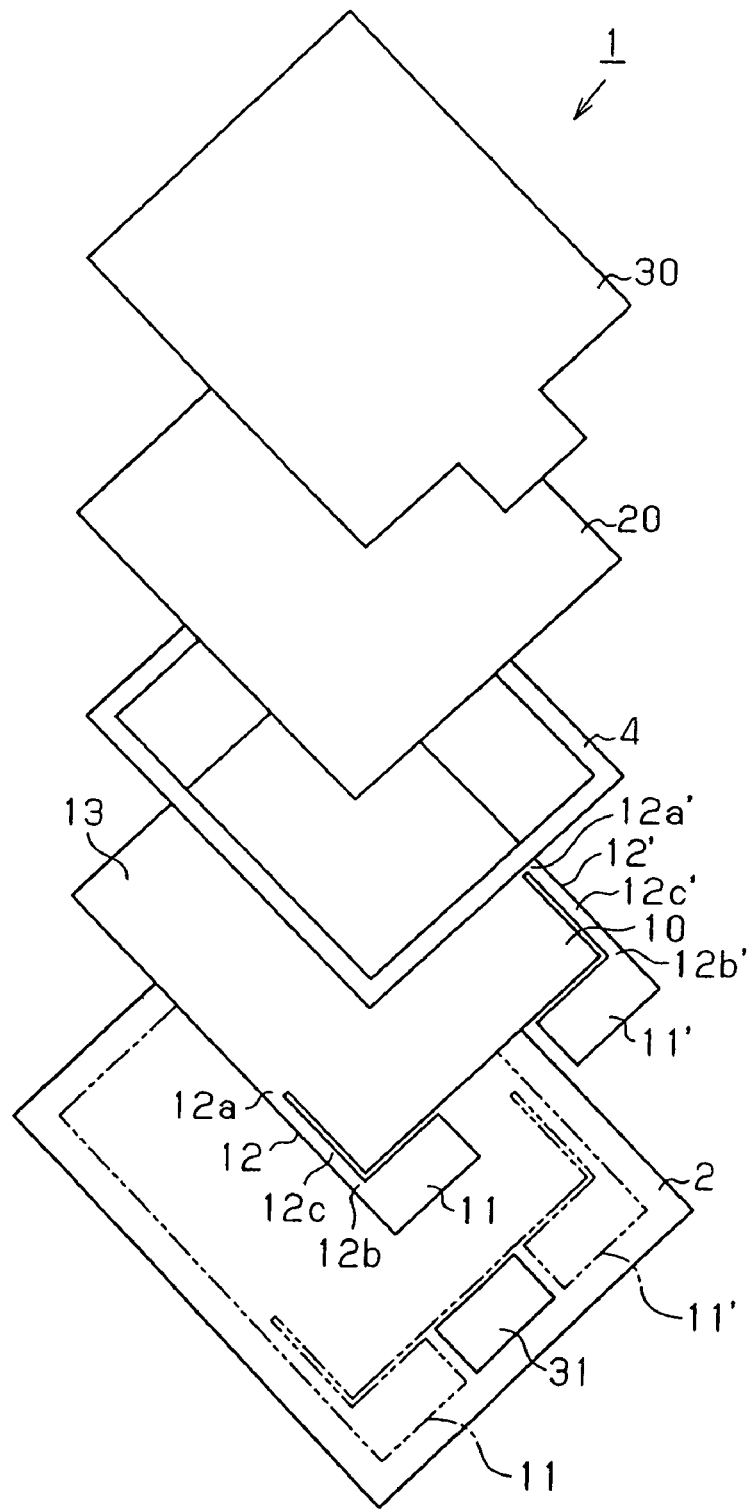
FIG. 17 is a schematic exploded perspective view of an organic EL device having an insulated section.
Figure 19:
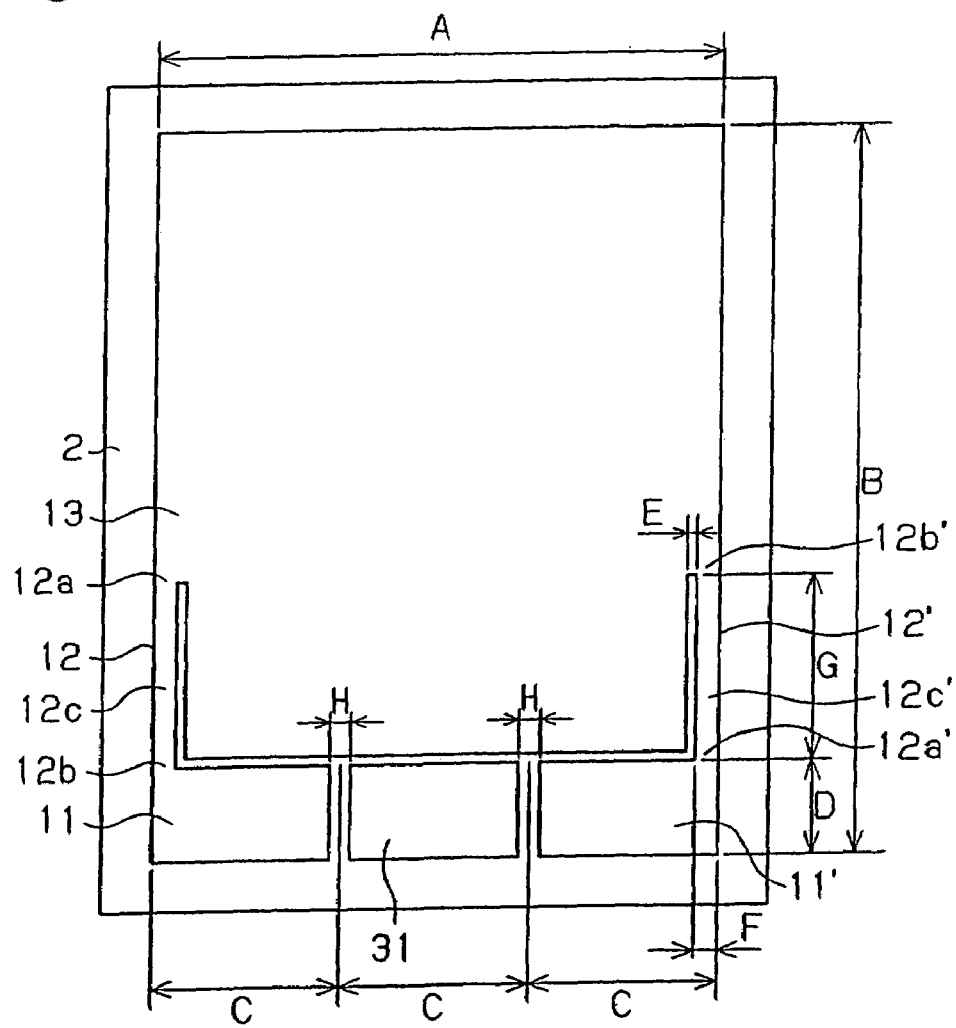
FIG. 19 is a schematic top view showing the arrangement of an electrode region, a terminal section, etc. of an anode on a substrate.

As shown in FIGS. 12(*a*) to 12(*c*), when the terminal sections 11 and 11' of the anode are arranged in the vicinities of the both ends of the one short side 13-1 of the outer periphery of the electrode region 13 of the anode, as shown in FIG. 17 and FIG. 19, it is good to arrange the terminal section 31 of the cathode between the terminal sections 11 and 11' of the anode. Thereby, since it is possible to provide all terminals nearby one side (preferably nearby the short aide 13-1) of the electrode region 13 of the anode, wiring with the external driver circuit becomes easy, in addition, since terminals exist only nearby one side to an electrode region, it is possible to perform miniaturization rather than the conventional organic EL devise where terminals exist nearby a plurality of sides. When a space where an organic EL device can be arranged is limited like a personal digital assistant, it also becomes possible to enlarge the size of an electrode region 13, that is, a luminous region rather than that of a conventional organic EL device.

Naturally, when the joints 12*a* and 12*b* where the respective conductive sections 12 and 12' of the anode connect with the electrode region 13 of the anode are suitably set as explained in the modified example 4, it also become possible to obtain the above-mentioned advantages in a better extent.

Modified Example 8

Figure 14A:
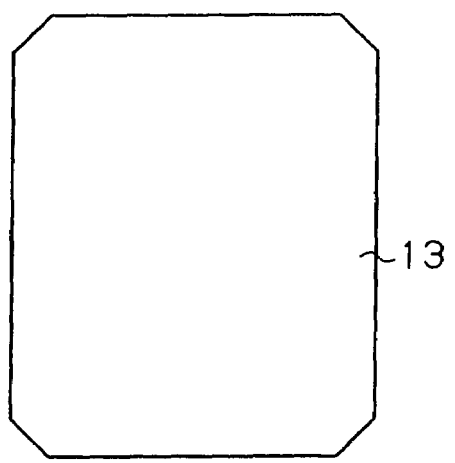
FIGS. 14(a) and 14(b) each is a top view of a modified example of an electrode region of an anode.
Figure 14B:
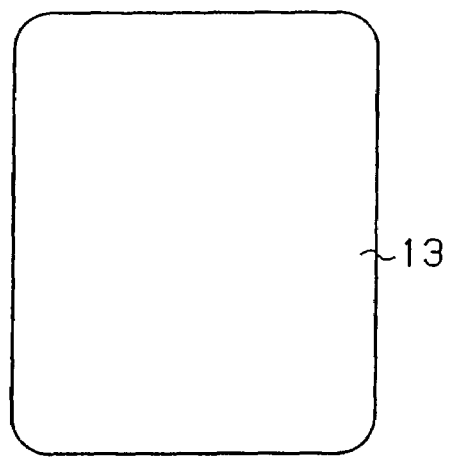

The shape of the electrode region 13 of the anode is not limited to a rectangle. For example, as shown in FIG. 14(a), it may be also a corner-cut (chamfered) shape, or, as shown in FIG. 14(b), it may be also a corner-rounded shape. It is not necessary that each side is a strict straight line, but, for example, a shape is adoptable so long as the shape is a shape equivalent to a rectangle in practice even if the shape has a curvilinear section partially or one side is a curve as a whole. That is, the electrode region 13 of the anode having such a shape is also included in the "substantially rectangular" electrode region 13 of the anode in the present invention.

Since it becomes possible to relax a phenomenon that electric power concentrates on a corner when the corner of the electrode region 13 of the anode is cut or rounded, it becomes possible to obtain the above mentioned advantage in a better extent.

Figure 15:
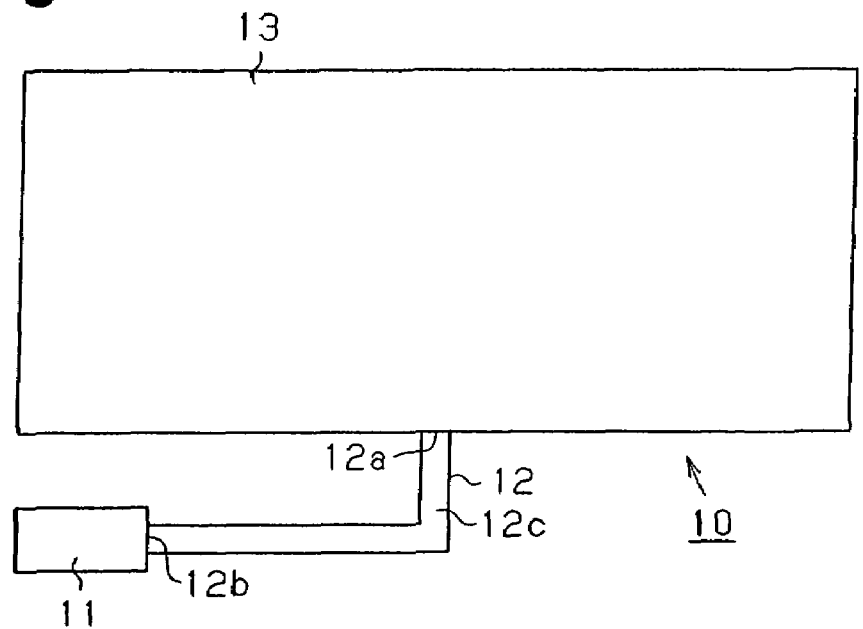
FIG. 15 is a schematic top view of an anode of a modified example where a position of a terminal section differs.

In addition, although the example that the terminal section 11 of the anode is provided in a position which faces a short side of the electrode region 13 of the anode is shown in each example mentioned above, it is also good to provide the terminal section 11 of the anode in a position, which faces a long side, as shown in FIG. 15.

Modified Example 9

Naturally, it is also possible to provide a supporting electrode. The supporting electrode can be provided in at least one among the terminal section 11 of the anode, the conductive section 12 of the anode, and the electrode regions 13 of the anode. Thereby, it becomes possible to lower the volume resistivity of the anode 10.

Modified Example 10

Figure 16:
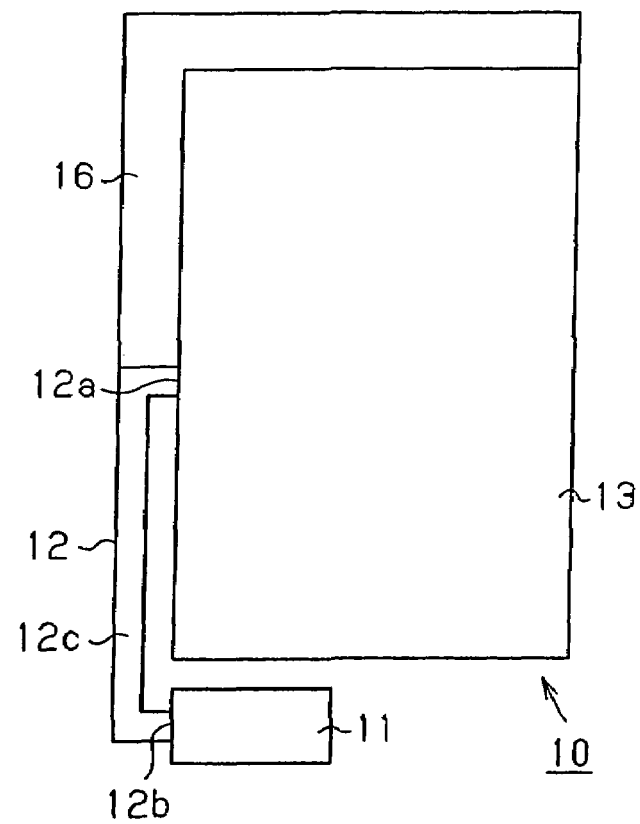
FIG. 16 is a top view of an anode of another modified example.

As shown in FIG. 16, it is also good to provide in the anode 10 a portion 16 other than the terminal section 11 of the anode, the conductive section 12 of the anode, and the electrode regions 13 of the anode. When the difference between electric potential in a joint of the conductive section 12 of the anode, and the electrode region 13 of the anode, and electric potential in each joint of the portion 16 and the electrode region 13 of the anode is made small by providing a auxiliary electrode in this portion 16, it becomes also possible to obtain the above-mentioned advantages in better extent. That is, it becomes possible to obtain the advantages substantially equivalent to extremely increasing the number of the second joint 12a between the conductive section 12 of the anode, and the electrode region 13 of the anode.

Modified Example 11

Figure 18:
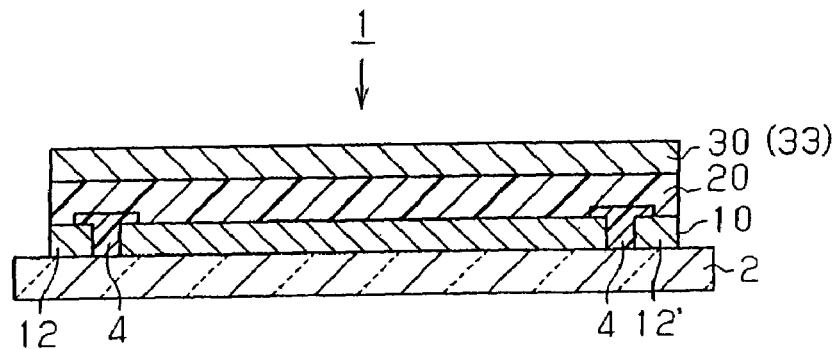
FIG. 18 is a schematic sectional view of the organic EL device having the insulated section.

In order to keep the anode 10 and cathode 30 from short-circuiting, it is good to provide an insulated section in the periphery of the organic layer 20, and in particular, between the conductive section 12 of the anode, and the cathode 30. Thus, as shown in FIGS. 17 to 19, it is also good to provide the anode 10 and the terminal section 31 of the cathode on the substrate 2, to provide the insulating layer 4 on the conductive sections 12 and 12' of the anode, to provide the organic layer 20 on the electrode region 13 of the anode, and to provide the electrode region 33 of the cathode on the organic layer 20.

As a material for forming the insulated section, it is possible to suitably adopt a material for forming the insulated section, which is adopted in a publicly known organic EL device. For example, what can be cited are $SiO_2$, SiON, $Al_2O_3$, $Si_3N_4$, SiAlON, $Y_2O_3$, $BaTlO_3$, $Sm_2O_3$, $BaTa_2O_6$, $Ta_2O_5$, ATO, $Al_2O_3$ $TiO_2$, $SrTiO_3$, and $PbTiO_3$. It is possible to adopt a publicly-known formation method as its formation method, and, for example, it is possible to adopt a sputtering method, electron ray vacuum deposition, CVD, or the like.

Modified Example 12

In order to protect the organic layer 20 and the like from the open air, it is also good to protect the first organic EL device 1 with a passivation film or a sealing can. In this case, it is necessary to protect the terminal section 11 of the anode, and the terminal section 31 of the cathode so as to be exposed to the outside of the device.

The passivation film is a protective layer (sealing layer) provided in the opposite side of the substrate in order to prevent the organic EL device 1 from contacting to oxygen and moisture. As a material used for the passivation film, for example, an organic polymer material, an inorganic material, and a photoresist can be cited. The material used for the protective layer may be used independently, or a plurality of materials may be used together. The protective layer may be also single structure, or, may be also stacked structure.

What are cited as examples of the organic polymer materials are fluorine system resins such as a chlorotrifluoroethylene polymer, a dichlorodifluorofluoroethylene polymer, and a copolymer of a chlorotrifluoroethylene polymer and a dichlorodifluoroethylene polymer, acrylic system resins such as polymethylmethacrylate and polyacrylate, an epoxy resin, a silicone resin, an epoxy silicone resin, a polystyrene resin, a polyester resin, a polycarbonate resin, a polyamide resin, a polyimide resin, a polyamidoimide resin, a polyparaxylene resin, a polyethylene resin, polyphenylene oxide resin.

What can be cited as the inorganic materials are polysilazane, a diamond membrane, amorphous silica, electric insulation glass, metal oxides, metal nitrides, metal carbonized materials, metal sulfides.

Generally, the sealing can is a member constituted by sealing members, provided in the opposite side to the substrate 2, such as a sealing plate or a sealing container in order to shut out moisture and oxygen from the outside. The sealing can be installed only in the electrode side in the back face side (opposite side to the substrate 2), or may cover the entire organic EL device 1. In regard to the thickness of the sealing member, so long as it can seal the organic EL device 1 and can shut out the external air, the shape, size, and thickness of the sealing member are not limited especially. Materials used for the scaling member are glass, stainless steel, metal (aluminum etc), plastics (polychlorotrifluoroethylene, polyester, polycarbonate, etc.), ceramics, etc.

When installing the sealing member in the organic EL device 1, it is also good to use an encapsulant (adhesive) suitably. When the entire organic EL device 1 is covered with the scaling member, it is also good to heat-seal the sealing members without using the encapsulant. As the encapsulant, an ultraviolet cure resin, a thermosetting resin, two-liquid cured resin, etc. are available.

It is also good to insert a moisture-absorbent in a space between the passivation film or a sealing can, and the organic EL device 1. The moisture absorbent is not limited especially, but what are cited as specific examples are barium oxide, sodium oxide, potassium oxide, calcium oxide, sodium sulfate, calcium sulfate, magnesium sulfate, phosphorus pentaoxide, calcium chloride, magnesium chloride, copper chloride, cesium fluoride, niobium fluoride, calcium bromide, barium bromide, a molecular sieve, zeolite, magnesium oxide, and the like.

In addition, it is also good to enclose a gas inactive to the passivation film or sealing can. The inactive gas means a gas, which does not react with the organic EL device 1, for example, rare gases such as a helium gas and an argon gas, and a nitrogen gas can be adopted.

Modified Example 13

Although the example that the anode 10 is integrally produced is shown in each example mentioned above, it is also good to produce each component or the anode 10 separately, and to form the anode 10 by combining them.

For example, it is also good to connect both with copper wires and the like after forming the terminal section 11 of the anode, and the electrode region 13 of the anode by ITO on the substrate 2. In this structure, the copper wires become the conductive section 12 of the anode.

Modified Example 14

It is also good not to adopt the structure of emitting light from the entire organic EL device, but to arrange a plurality of devices in a matrix form. In this case, it is also good to make it possible to display an image by using an organic EL device by using a passive matrix control method, an active matrix controlling method, etc.

Modified Example 15

Although the example that the anode is constituted with the material whose volume resistivity is higher than that of the cathode is shown in the above-mentioned example, it is sufficient to just perform the above-described processing for the cathode when the volume resistivity of the cathode is higher than that of the anode.

Although the example that the electrode in the substrate side is constituted with the material whose volume resistivity is higher than that of the electrode in another side is shown in the above-mentioned example, it is sufficient to just perform the above-described processing for the other electrode when the volume resistivity of the other electrode is higher than that of the electrode in the substrate side.

Modified Example 16

It is also possible to provide a high resistance section (third high resistance section) except the above-mentioned position.

Figure 20:
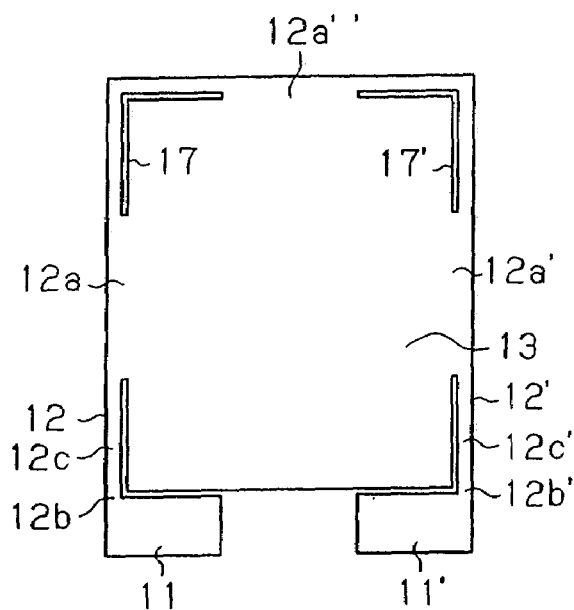
FIG. 20 is a schematic top view of an anode of a second organic EL device, which embodied the present invention.

For example, as shown in FIG. 20, it is also good to provide the third high resistance sections 17, 17' in a position, which is different from those of the high resistance section 14 and second high resistance section 15. Also owing to this, since it becomes possible that a plurality of second joints (the joint 12a, joint 12a', and joint 12a") between the conductive section 12 of the anode, and the electrode region 13 of the anode is provided substantially, there is a possibility of obtaining the above-mentioned advantages in a better extent.

Figure 21:
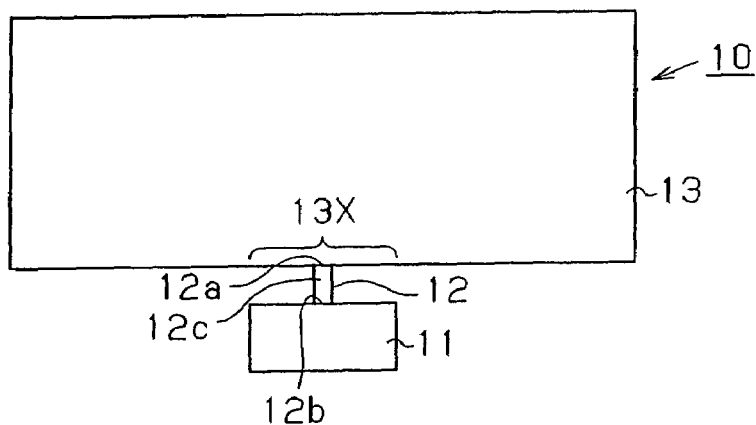
FIG. 21 is a schematic top view of an anode of a modified example where a position of a terminal section differs.
Figure 22:
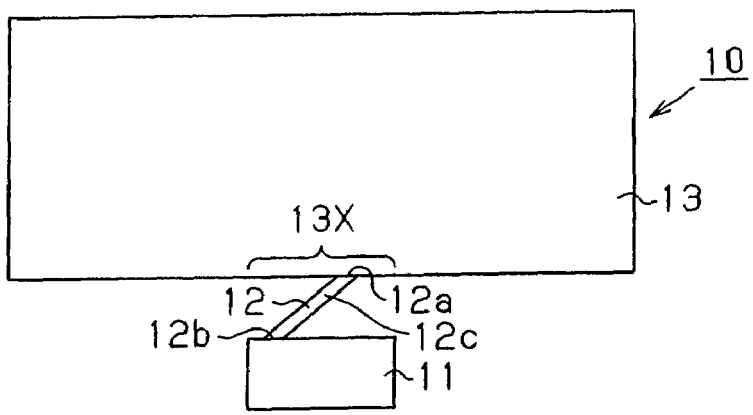
FIG. 22 is a schematic top view of an anode or a modified example where a position of a terminal area differs.

Next, a second organic EL device, which relates to the present invention, will be explained. FIGS. 21 and 22 show the structure of the anode 10 for explaining the structure of the second organic EL device. The following structure is used for the second organic EL device.

An organic layer is sandwiched by a pair of electrodes and one electrode (anode) is formed of a material whose volume resistivity is higher than that of another electrode (cathode).

The anode has at least one electrode region of the anode which contacts to the organic layer, a terminal section of the anode to which an external drive circuit is connected, and a conductive section of the anode.

The electrode region of the anode is substantially rectangular.

The terminal section of the anode is located in a position along the outer periphery of the electrode region of the anode, and electrically connected to the electrode region of the anode through the conductive section of the anode.

The conductive section of the anode include a joint connected to the terminal section of the anode, a joint connected to the electrode region of the anode, and a main body of the conductive section which electrically connects both joints and does not electrically connect the electrode region and terminal section.

The joint connected to the electrode region of the anode is connected to the electrode, region of the anode in a part of a portion, which faces the terminal section in the outer periphery of the electrode region of the anode.

That is, as shown in FIGS. 21 and 22, in the second organic EL device, a position of the second joint 12a of the conductive section 12 of the anode connected to the electrode region 13 of the anode is provided in a part of portion 13X which faces the terminal section 11 in the outer periphery of the electrode region 13 of the anode.

The second organic EL device can be also modified similarly to the organic EL device 1 within a range of being not contradictory to the above-mentioned structure. In particular, it is good to determine a position of the second joint. 12a of the conductive section 12 of the anode, which connects with the electrode region 13 of the anode, like the above-mentioned modified example 4.

For example, as shown in FIGS. 21 and 22, it is good to set the position of the second joint 12a in a position where plant distance to the outer periphery of the electrode region 13 of the anode is short in the portion 13X which faces the terminal section 11 in the outer periphery of the electrode region 13, or nearby this position. Owing to this setting, it is possible to obtain the advantages equivalent to the above-mentioned ones because of the same reasons (actions) as those of the first organic EL device.

In addition, naturally, it is also possible to combine the second organic EL device and first organic EL device.

Figure 23A:
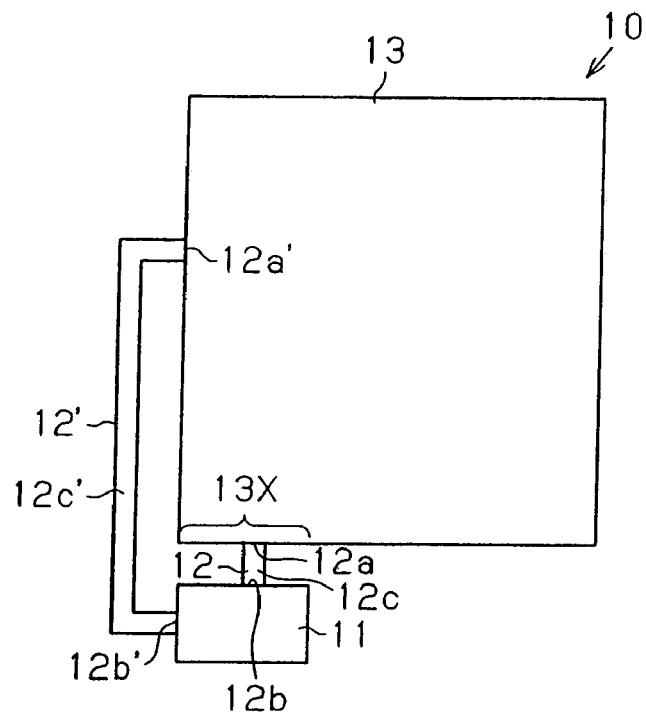
FIGS. 23(a) and 23(b) each is a top view of an anode formed by combining the first and second organic EL devices.

For example, as shown in FIG. 23(*a*), two conductive sections 12 and 12' of the anode are provided, the conductive section 12 is made in the structure of the second organic EL device, that is, the second conductive section, and the conductive section 12' is made in the structure of the first organic EL device, that is, the first conductive section. Specifically, these are performed as follows.

The conductive section 12 connects with the electrode region 13 of the anode in a part of the portion 13X, which faces the terminal section 11 in its outer periphery.

The conductive section 12' connects with the electrode region 13 of the anode in a portion different from the portion 13X, which faces the terminal section 11 in its outer periphery.

In addition, naturally, it is also possible to provide plenty of respective joints extremely, that is, to provide them in a perforation form.

In these cases, it is preferable to perform such design that the difference between amounts of currents flowing through respective positions of the organic layer becomes small by adjusting the length of portions contacting to the joints and electrode region.

Figure 23B:
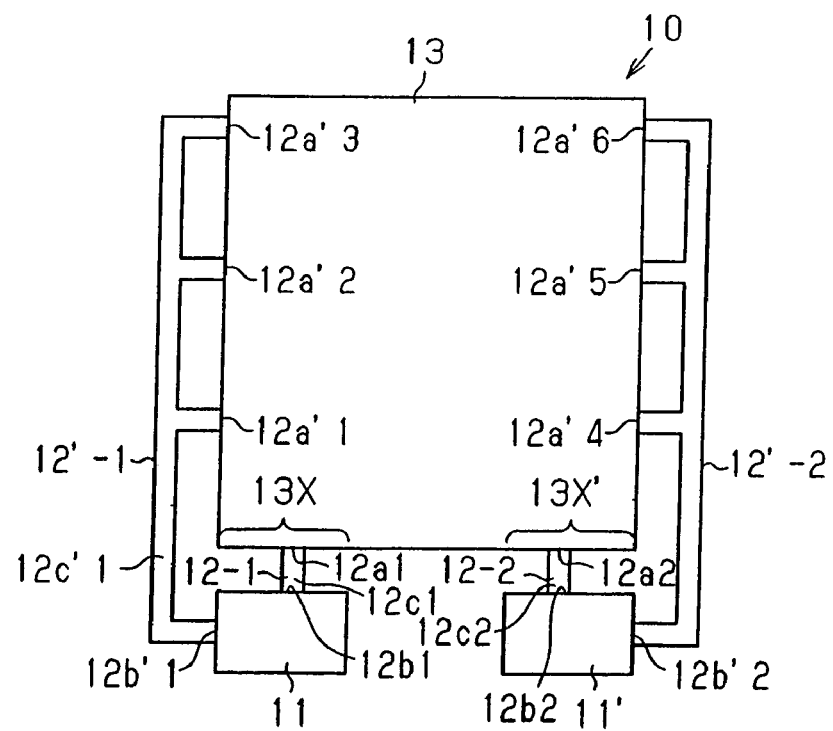
Figure 26:
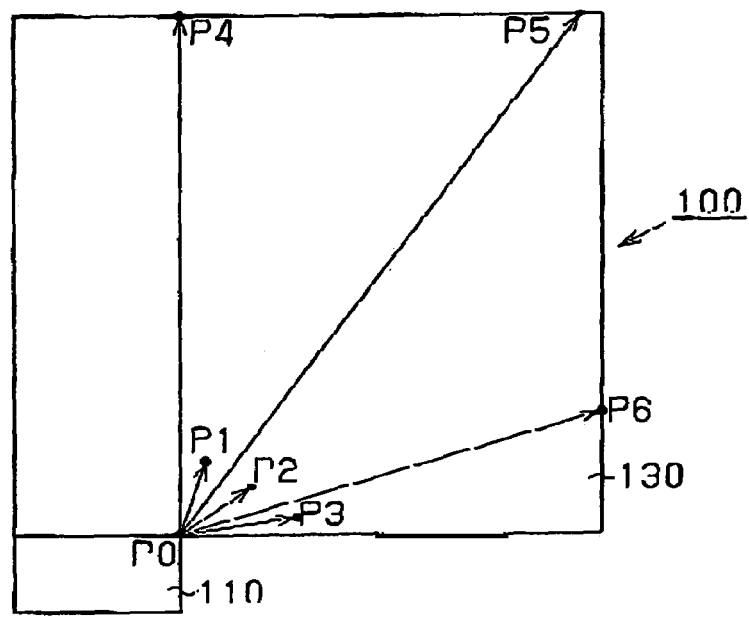
FIG. 26 is a schematic diagram for explaining resistance difference between respective paths, in which currents flow, in an organic electroluminescence device.
Figure 27:
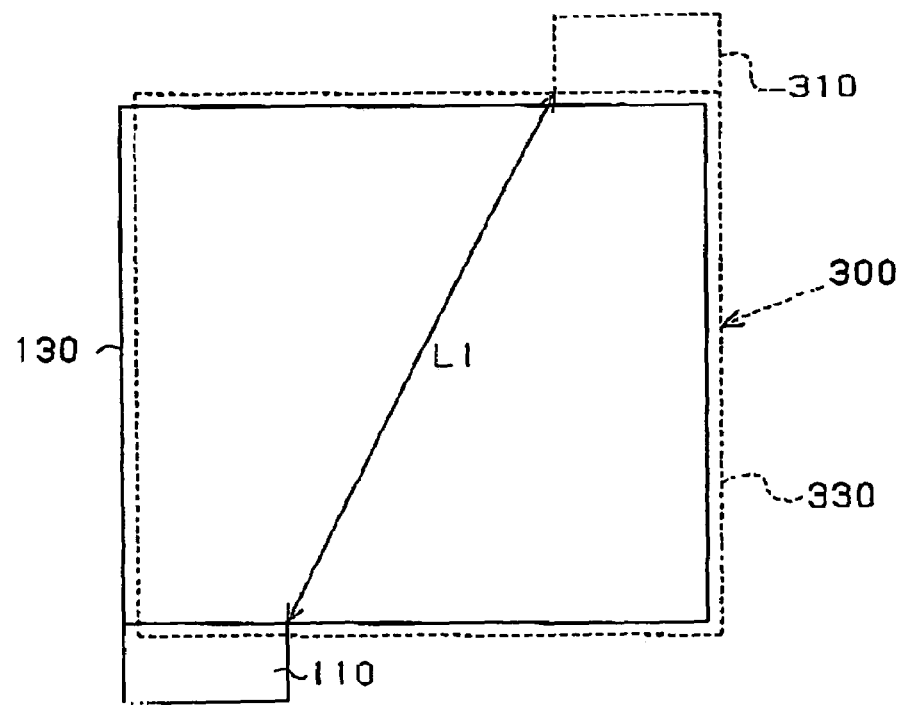
FIG. 27 is a schematic diagram for explaining resistance difference between respective paths, in which currents flow, in the organic electroluminescence device shown in FIG. 26.

Furthermore, as shown in FIG. 23(b), naturally, it is also possible to provide plenty of terminal sections in the outer periphery of the electrode region 13 of the anode, that is, locations electrically connected to the external drive circuit. That is, it is also good to perform constitution so as to satisfy the following requirements.

The device has the electrode region 13 of the anode, two terminal sections 11 and 11', two first conductive sections 12'-1 and 12'-2, which are connected respectively to terminal sections mutually different, and two second conductive sections 12-1 and 12-2, which is connected, respectively to terminal sections mutually different.

The terminal-section 11 is connected to the electrode region 13 of the anode electrically through the conductive sections 12'-1 and 12-1. The terminal section 11' is connected to the electrode region 13 of the anode electrically through the conductive sections 12'-2 and 12-2.

The electrode region 13 of the anode is made substantially rectangular.

As shown in the figure, the respective terminal sections 11 and 11' are arranged in the vicinities of the both ends of one short side of the outer periphery of the electrode region 13 of the anode.

The conductive sections 12'-1 and 12'-2 are connected to the electrode region 13 in different long sides in the outer periphery of the electrode region 13 of the anode, respectively. In this example, second joints 12a'1 to 12a'6 every three locations are provided.

The conductive sections 12-1 and 12-2 are connected to the electrode region 13 at a part of the portions 13X and 13X' which face the terminal section in the electrode region 13 of the anode. In this example, second joints 12a1 and 12a2 every one location are provided.

In this case, it becomes very easy to design the amounts of currents, which flow through respective positions of the organic layer 20, substantially uniformly.

Next, a third organic EL device, which relates to the present invention, will be explained. The third organic EL device is characterized in that an organic layer is sandwiched by a pair of electrodes, that any electrodes are formed of materials with substantially the same volume resistivity, and that at least one electrode has the structure of the anodes in the first and second organic EL devices, or the structure of modifying the anodes. Since this structure is adopted, it is possible to obtain the advantages equivalent to the above-mentioned ones because of the same reasons as described above.

Preferably, it is more effective when both of electrodes have the structure of the first and second organic EL devices. In this case, it is also good to constitute an anode and a cathode as follows, for example.

Anode: cathode

Structure equivalent to that of the anode in the first organic EL device: Structure equivalent to that of the anode in the first organic EL device Structure equivalent to that of the anode in the first organic EL device: Structure equivalent to that of the anode in the second organic EL device Structure equivalent to that of the anode in the second organic EL device; Structure equivalent to that of the anode in the first organic EL device Structure equivalent to that of the anode in the second organic EL device: Structure equivalent to that of the anode in the second organic EL device

EXAMPLES

Hereinafter, although an organic EL device, which relates to the present invention, will be explained in further detail according to examples, it is natural that the present invention should not be interpreted with limiting to the following examples.

Example 1

As shown in FIG. 24, a substrate that an ITO layer with 30 mm of lateral length A, 40 mm of vertical length B, and 220 nm of film thickness was formed on the transparent glass substrate 2 with 40 mm of lateral length, and 50 mm of vertical length was prepared. The terminal section 11 of the anode, the conductive section 12 of the anode, and the electrode region 13 of the anode were formed by removing ITO from this substrate partially by a laser repair apparatus. The dimensions of respective parts in FIG. 24 are as follows.

Length C=10 mm,
Length D=3 mm
Width E=10 μm to 20 μm
Distance F=3 mm
Gap H=10 μm to 20 μm
(Notch G explained later is zero.)

Substrate clearing of the substrate 2 where the anode 10 was formed as described above was performed. As the substrate clearing, alkali cleaning and deionized water cleaning were performed by turns, and after drying, ultra-violet ray ozone clearing was performed.

After substrate clearing, the insulating layer 4 made of $SiO_2$ by an RF sputtering method was provided in the outer periphery of the electrode region 13 of the anode, which includes at least the conductive section 12 of the anode.

After the insulating layer formation, an organic layer, which includes a hole transportation layer, a luminescent layer, and an electron transportation layer was formed on the electrode region 13 of the anode.

First, on the electrode region 13 of the anode, a 30-nm-thick TPTE layer was produced by a vacuum evaporation system (carbon crucible, deposition rate: 0.1 nm/s, degree of vacuum: about $5.0 \times 10^{-5}$ Pa), and this layer was made the hole transportation layer.

On the hole transportation layer, a layer formed by codepositing 30-nm-thick DPVBi (93.0% of the weight, host material) and BCzVBi (7.0% of the weight, guest material) by a vacuum evaporation system (carbon crucible, deposition rate: 0.1 nm/s, degree of vacuum: about $5.0 \times 10^{-5}$ Pa) was produced, and this layer was made the luminescent layer.

On the luminescent layer, a layer of 20-nm-thick 2, 5-bis (6'-(2',2''-bipyridyl) )-1,1-dimethyl-3,4-diphenylsilole was produced by the vacuum evaporation system (carbon crucible, deposition rate: 0.1 nm/s, degree of vacuum; about $5.0 \times 10^{-5}$ Pa), and this layer was made the electron transportation layer.

On the electron transportation layer, a layer of 150-nm-thick aluminum was formed on a tungsten board (deposition rate: 1 nm/s, degree of vacuum: about $5.0 \times 10^{-5}$ Pa), and this layer was made the electrode region 33 of the cathode. In addition, the terminal section 31 of the cathode was formed by the same method on the substrate 2, and the conductive section 32 of the cathode was formed by the same method between the terminal section 31 of the cathode, and the electrode region 33 of the cathode for the cathode 30 to be formed, and further for the organic EL device to be produced.

In the opposite side of the substrate 2, film sealing was performed to the produced organic EL device with a passivation film made of $SiO_2$ so that the terminal section 11 of the anode and the terminal section 31 of the cathode might be exposed to the outside.

Then, the terminal section 11 of the anode and the terminal section 31 of the cathode, and external electrodes were connected, a 150 mA constant current is flowed, and after 5 minutes since the current had been flowed, the luminance of the film-sealed organic EL device was measured.

As shown in FIG. 25(a), the measurement points of the luminance was determined to be intersection points obtained by dividing respective sides of a luminous region of the organic EL device 1 by 10 equally, and drawing straight lines which divided respective sides in the ratio of 1:4:4;1. Each intersection point was named a, b, and c from the upper left, d, e, and f from the middle left, and g, h, and i from the lower left. Measurement of the luminance was performed by using a luminance-measuring instrument (made by TOPCON, trade name: BM7). The measurement is shown in Table 1. Table 1 shows luminance ratios, each of which is obtained by dividing the luminance measured in each measurement point by the luminance of a point whose luminance was the smallest.

Example 2

An organic EL device, which relates to an example 2, adopted the anode 10 with a shape shown in FIG. 25(b). The organic EL device was produced similarly to the example 1 except a point of having provided a 10-mm long notch G, and measured luminance similarly to the example 1. The measurement is shown in Table 1. Table 1 shows luminance ratios, each of which is obtained by dividing the luminance measured in each measurement point in the example 2 by the luminance of a point whose luminance was the smallest.

Example 3

An organic EL device, which relates to an example 3 was produced similarly to the example 2 except a point of having provided a 20-mm long notch G, and measured luminance similarly to the example 1. The measurement is shown in Table 1. Table 1 shows luminance ratios, each of which is obtained by dividing the luminance measured in each measurement point in the example 3 by the luminance of a point whose luminance was the smallest.

Comparative Example

In the comparative example, as shown in FIG. 25(c), the organic EL device was produced similarly to the example 1 except the points of omitting the conductive section 12 of the anode and directly connecting the terminal section 11 of the anode, and the electrode region 13 of the anode, and luminance was measured similarly to the example 1. The measurement is shown in Table 1. Table 1 shows luminance ratios, each of which is obtained by dividing the luminance measured in each measurement point in the comparative example by the luminance of a point whose luminance was the smallest.

TABLE 1

| Measurement Point | Example 1 | Example 2 | Example 3 | Comparative Example 1 |
|---|---|---|---|---|
| a | 1.00 | 1.00 | 1.13 | 1.07 |
| b | 1.12 | 1.00 | 1.28 | 1.12 |
| c | 1.02 | 1.03 | 1.18 | 1.00 |
| d | 1.44 | 1.55 | 1.60 | 1.56 |
| e | 1.69 | 1.58 | 1.47 | 1.74 |
| f | 1.46 | 1.40 | 1.39 | 1.44 |
| g | 1.79 | 1.54 | 1.13 | 2.05 |
| h | 2.05 | 1.45 | 1.11 | 2.68 |
| i | 2.16 | 1.30 | 1.00 | 2.42 |
| Average Luminance | 1.70 | 1.34 | 1.15 | 1.90 |

Evaluation

The luminance ratio of a measurement point having the largest luminance to a measurement point having the smallest luminance was 2.68 in the comparative example. On the other hand, in the organic EL device in the example 1 where the terminal section 11 of the anode and the electrode region 13 of the anode were separated (space was 3 mm), the above-mentioned luminance ratio was 2.16.

In addition, the above-mentioned luminance ratio was 1.58 in the example 2 where the 10-mm long notch G was provided, and the above-mentioned luminance ratio was 1.60 in the example 3 where the 20-mm long notch G was provided.

Thus, the organic EL devices in the examples 1 to 3 had each luminance ratio of a measure point having the largest luminance to a measure point having the smallest luminance, which was smaller than that of the organic EL device in the comparative example.

In addition, in the comparative example, the luminance in the measure point, which was the smallest in luminance to average luminance, was 54%, and the luminance in the measure point, which was the largest in luminance, was 141%. On the other hand, in the example 1, the luminance in the measure point, which was the smallest in luminance to average luminance, was 59% and the luminance in the measure point, which was the largest in luminance, was 127%. In the example 2, the luminance in the measure point, which was the smallest in luminance to average luminance, was 85%, and the luminance in the measure point, which was the largest in luminance, was 118%. In the example 3, the luminance in the measure point, which was the smallest in luminance to average luminance, was 87%, and the luminance in the measure point, which was the largest in luminance, was 139%.

That is, the organic EL devices in the examples 1 to 3 had a luminance ratio of each measurement point with the largest luminance to average luminance, which was smaller than a luminance ratio of each measurement point with the largest luminance to the average luminance in the organic EL device in the comparative example.

In addition, the organic EL devices in the examples 1 to 3 had a luminance ratio of each measurement point with the smallest luminance to average luminance, which was larger than a luminance ratio of each measurement point with the smallest luminance to the average luminance in the organic EL device in the comparative example.

Clearly also from the above evaluation, it was understood that the organic EL devices in the examples 1 to 3 had brightness unevenness less than the organic EL device in the comparative example. In addition, from this fact, it was understood that the organic EL device, which relates to the present invention had the difference between values of currents, which flow through respective points in a display area, the difference that was smaller than that in the organic EL device in the comparative example.

The invention claimed is:

1. An organic electroluminescent device, comprising:
   a first electrode;
   a second electrode that is formed of a material the volume resistivity of which is equal to or higher than the volume resistivity of the first electrode; and
   an organic layer located between the first electrode and the second electrode,
   wherein the second electrode includes:
      a substantially rectangular electrode region that contacts the organic layer;
      a terminal section to which an external drive circuit is connected,
      wherein the terminal section is located in a predetermined position along the outer periphery of the electrode region; and
      a conductive section that electrically connects the terminal section to the electrode region,
   wherein the conductive section includes:
      a first joint connected to the terminal section;
      a second joint connected to the outer periphery of the electrode region; and
      a conductive section main body that extends between the first joint and the second joint to electrically connect the first joint to the second joint, wherein the terminal section does not contact with the electrode region, wherein the conductive section main body extends between the first joint and the second joint without being contacted to the electrode region and the terminal section, wherein the electrode region, the terminal section and the conductive section are integrally made of a common material.

2. The device according to claim 1, wherein the outer periphery of the electrode region includes a facing portion that faces the terminal section and a non-facing portion that does not face the terminal section, and wherein the second joint is connected to the electrode region at the non-facing portion.

3. The device according to claim 1, wherein the outer periphery of the electrode region includes a facing portion that faces the terminal section and a non-facing portion that does not face the terminal section, and wherein the second joint is connected to the electrode region at a part of the facing portion.

4. The device according to claim 1, wherein the conductive section is one of a plurality of conductive sections, wherein the outer periphery of the electrode region includes a facing portion that faces the terminal section and a non-facing portion that does not face the terminal section, wherein the second joint of at least one of the conductive sections is connected to the electrode region at the non-facing portion, and wherein the second joint of another conductive section is connected to the electrode region at a part of the facing portion.

5. The device according to claim 1, wherein the outer periphery of the electrode region has a pair of short sides and a pair of long sides, wherein the terminal section is one of a pair of terminal sections, the terminal sections being arranged in the vicinities of the ends of one of the short sides; and wherein the conductive section is one of a pair of conductive sections each corresponding to one of the terminal sections, each conductive section electrically connecting the corresponding terminal section to the electrode region at different one of the long sides of the electrode region.

6. The device according to claim 5, wherein the first electrode includes: a terminal section to which an external drive circuit is connected, wherein the terminal section is located between the terminal sections of the second electrode; and an electrode region that contacts the organic layer.

7. The device according to claim 1, wherein the outer periphery of the electrode region has a pair of short sides and a pair of long sides, wherein the terminal section is one of a pair of terminal sections, the terminal sections being arranged in the vicinities of the ends of one of the short sides; wherein the conductive section is one of a pair of first conductive sections each corresponding to one of the terminal sections and a pair of second conductive sections each corresponding to one of the terminal sections; wherein each first conductive section electrically connects the corresponding terminal section to the electrode region at different one of the long sides of the electrode region; and wherein each second conductive section electrically connects the corresponding terminal section to the electrode region at a part of a portion in one of the short sides of the electrode region, which portion faces the corresponding terminal section.

8. The device according to claim 7, wherein the first electrode includes: a terminal section to which an external drive circuit is connected, wherein the terminal section is located between the terminal sections of the second electrode; and an electrode region that contacts the organic layer.

9. The device according to claim 1, wherein the second joint is one a plurality of second joints, the second joints being connected to the outer periphery of the electrode region at different positions.

10. The device according to claim 1, wherein the conductive section extends along the outer periphery of the electrode region.

11. The device according to claim 1, wherein the second joint is located at a position in the outer periphery of the electrode region or in the vicinity of the position, wherein the difference between the maximum value and the minimum value of resistance between the position and respective points on the outer periphery of the electrode region is less than the difference between the maximum value and the minimum value of resistances between respective points of the portion of the terminal section in the case where at that portion the terminal section is directly electrically connected to the electrode region in the minimum distance, and respective points on the outer periphery of the electrode region.

12. The device according to claim 1, wherein a high resistance section is provided between the electrode region and the conductive section, and wherein the high resistance section is formed of a material the volume resistivity of which is higher than the volume resistivity of the electrode region.

13. The device according to claim 1, wherein a high resistance section is provided between the terminal section and the electrode region, and wherein the high resistance section is formed of a material the volume resistivity of which is higher than the volume resistivity of the conductive section.

14. The device according to claim 1, wherein the width of the conductive section is less than the width of the terminal section.

15. The device according to claim 1, wherein the width of the conductive section is less than the width of the terminal section, wherein the outer periphery of the electrode region has a pair of short sides and a pair of long sides, wherein the terminal section is one of a pair of terminal sections, the terminal sections being arranged in the vicinities of the ends of one of the short sides; wherein the conductive section is one of two conductive sections, each corresponding to one of the terminal sections, and wherein each conductive section electrically connects the corresponding terminal section to the electrode region at the corresponding end of the short side.

16. The device according to claim 1, further comprising a substrate and an electrode layer is formed on the substrate as spreading evenly, wherein the terminal section, the conductive section and the electrode region of the second electrode are formed by removing a portion of the electrode layer other than the terminal section, the conductive section and the electrode region from the electrode layer by etching.

17. An organic electroluminescent device, comprising:
a first electrode;
a second electrode that is formed of a material the volume resistivity of which is equal to or higher than the volume resistivity of the first electrode; and
an organic layer located between the first electrode and the second electrode,
wherein the second electrode includes:
  a substantially rectangular electrode region that contacts the organic layer;
  a terminal section to which an external drive circuit is connected,
  wherein the terminal section is located in a predetermined position along the outer periphery of the electrode region; and
  a conductive section that electrically connects the terminal section to the electrode region, wherein the width of the conductive section is less than the width of the terminal section,
  wherein the conductive section includes;
    a first joint connected to the terminal section;
    a second joint connected to the outer periphery of the electrode region; and
    a conductive section main body that, without being electrically connected to the electrode region and the terminal section, extends between the first joint and the second joint to electrically connect the first joint to the second joint,
    wherein the outer periphery of the electrode region includes a facing portion that faces the terminal section and a non-facing portion that does not face the terminal section,
    wherein the second joint is connected to the electrode region at the non-facing portion, wherein the conductive section extends along the outer periphery of the electrode region, and
    wherein the second joint is located at a position in the outer periphery of the electrode region or in the vicinity of the position,
    wherein the difference between the maximum value and the minimum value of resistances between the position and respective points on the outer periphery of the electrode region is less than the difference between the maximum value and the minimum value of resistances between respective points of the portion of the terminal section in the case where at that portion the terminal section is directly electrically connected to the electrode region in the minimum distance, and respective points on the outer periphery of the electrode region.

18. The device according to claim 17, further comprising a second joint that is connected to the electrode region at a part of the facing portion.

19. An organic electroluminescent device, comprising:
a first electrode;
a second electrode that is formed of a material the volume resistivity of which is equal to or higher than the volume resistivity of the first electrode; and
an organic layer located between the first electrode and the second electrode,
wherein the second electrode includes:
  a substantially rectangular electrode region that contacts the organic layer;
  a terminal section to which an external drive circuit is connected,
  wherein the terminal section is located in a predetermined position along the outer periphery of the electrode region; and
  a conductive section that electrically connects the terminal section to the electrode region,
  wherein the width of the conductive section is less than the width of the terminal section, wherein the conductive section includes:
    a first joint connected to the terminal section;
    a second joint connected to the outer periphery of the electrode region; and
    a conductive section main body that, without being electrically connected to the electrode region and the terminal section, extends between the first joint and the second joint to electrically connect the first joint to the second joint,
    wherein the outer periphery of the electrode region has a pair of short sides and a pair of long sides,
    wherein the terminal section is one of a pair of terminal sections, the terminal sections being arranged in the vicinities of the ends of one of the short sides,
    wherein the conductive section is one of a pair of conductive sections each corresponding to one of the terminal sections, each conductive section electrically connecting the corresponding terminal section to the electrode region at different one of the long sides of the electrode region,
    wherein the conductive sections extend along the outer periphery of the electrode region,
    wherein the second joint is located at a position in the outer periphery of the electrode region or in the vicinity of the position,
    wherein the difference between the maximum value and the minimum value of resistances between the position and respective points on the outer periphery of the electrode region is less than the difference between the maximum value and the minimum value of resistances between respective points of the portion of the terminal section in the case where at that portion the terminal section is directly electrically connected to the electrode region in the minimum distance, and respective points on the outer periphery of the electrode region, and
  wherein the first electrode includes:
    a terminal section to which an external drive circuit is connected,
    wherein the terminal section is located between the terminal sections of the second electrode; and
    an electrode region that contacts the organic layer.

* * * * *

UNITED STATES PATENT AND TRADEMARK OFFICE
CERTIFICATE OF CORRECTION

| | | |
|---|---|---|
| PATENT NO. | : 7,196,466 B2 | Page 1 of 9 |
| APPLICATION NO. | : 10/926383 | |
| DATED | : March 27, 2007 | |
| INVENTOR(S) | : Masato Hieda et al. | |

It is certified that error appears in the above-identified patent and that said Letters Patent is hereby corrected as shown below:

Column 1, line 28, please delete "may largely differ" and insert therefore -- may differ largely --;

Column 1, lines 32-33, please delete "brightness unevenness occurs as the entire device." and insert therefore -- unevenness in brightness occurs throughout the entire device. --;

Column 1, lines 35-38, please delete "the difference of luminance occurs between both to become brightness unevenness, when a location where a rich current flows and a location where a poor current flows exist." and insert therefore -- the difference in luminescence between a location where a rich current flows and a location where a poor current flows results in brightness unevenness. --;

Column 1, lines 43-47, please delete "For this reason, a location, which has a short lifetime in comparison with a device where a uniform current flows, exists, and hence, a lifetime as the organic electroluminescence device becomes short." and insert therefore -- Thus, a location which has a short lifetime in comparison with a location where uniform current flows will result in an electroluminescence device with a shorter lifetime. --;

Column 1, line 56, please delete "Since there are" and insert therefore -- Since there is --;

Column 1, line 62, please delete "material, hence," and insert therefore -- material. Hence, --;

Column 2, line 18, please delete "aluminum, in" and insert therefore -- aluminum. In --;

Column 2, line 26, please delete "terminal, section 110" and insert therefore -- terminal section 110 --;

Column 2, lines 30-31, please delete "which a current is flowed in" and insert therefore -- through which a current flows --;

Column 2, line 35, please delete "110 contacts to the" and insert therefore -- 110 contacts the --;

UNITED STATES PATENT AND TRADEMARK OFFICE
CERTIFICATE OF CORRECTION

PATENT NO. : 7,196,466 B2
APPLICATION NO. : 10/926383
DATED : March 27, 2007
INVENTOR(S) : Masato Hieda et al.

It is certified that error appears in the above-identified patent and that said Letters Patent is hereby corrected as shown below:

Column 2, line 36, please delete "on an electrode region 130 to respective points" and insert therefore -- to respective points --;

Column 2, line 37, please delete "P1 to P2" and insert therefore -- P1 to P6 --;

Column 2, line 52, please delete "an anode a cathode" and insert therefore -- an anode and a cathode --;

Column 3, line 4, please delete "are proposed as prior art, which" and insert therefore -- are proposed which --;

Column 3, line 17, please delete "provided with facing" and insert therefore -- provided facing --;

Column 3, line 32, please delete "a final electrode" and insert therefore -- a first electrode --;

Column 3, line 60, please delete "embodied" and insert therefore -- embodies --;

Column 4, line 37, please delete "embodied" and insert therefore -- embodies --;

Column 4, line 40, please delete "anode or a modified" and insert therefore -- anode of a modified --;

Column 4, line 66, please delete "embodied" and insert therefore -- embodies --;

Column 5, line 2, please delete "features." and insert therefore -- features: --;

Column 5, line 32, please delete "referring to figures." and insert therefore -- referring to the figures --;

Column 5, line 64, please delete "region 13 or the anode" and insert therefore -- region 13 of the anode --;

Column 6, line 4, please delete "one end at" and insert therefore -- one end of --;

UNITED STATES PATENT AND TRADEMARK OFFICE
CERTIFICATE OF CORRECTION

PATENT NO.          : 7,196,466 B2
APPLICATION NO. : 10/926383
DATED                   : March 27, 2007
INVENTOR(S)         : Masato Hieda et al.

It is certified that error appears in the above-identified patent and that said Letters Patent is hereby corrected as shown below:

Column 6, line 10, please delete "13 of tho" and insert therefore -- 13 of the --;

Column 6, line 44, please delete "nitride, metals" and insert therefore -- nitride; metals --;

Column 6, line 65, please delete "also multiple" and insert therefore -- also a multiple --;

Column 6, line 67, please delete "composition of different" and insert therefore -- composition or different --;

Column 7, line 32, please delete "functions." and insert therefore -- functions described below. --;

Column 7, line 33, please delete "layer laminated" and insert therefore -- layer a laminated --;

Column 7, line 34, please delete "one of functions" and insert therefore -- one of the functions --;

Column 7, line 35, please delete "functions by a" and insert therefore -- functions described below by a --;

Column 7, line 38, please delete "(cathode). Electron" and insert therefore -- (cathode) – an electron --;

Column 7, line 41, please delete "(anode). Positive" and insert therefore -- (anode – a positive --;

Column 7, line 44, please delete "holes. Carrier" and insert therefore -- holes - carrier --;

Column 7, line 53, please delete "light wheel" and insert therefore -- light when --;

Column 7, line 65, please delete "forming tho" and insert therefore -- forming the --;

Column 8, line 17, please delete "material may be" and insert therefore -- material) may be --;

UNITED STATES PATENT AND TRADEMARK OFFICE
CERTIFICATE OF CORRECTION

PATENT NO. : 7,196,466 B2
APPLICATION NO. : 10/926383
DATED : March 27, 2007
INVENTOR(S) : Masato Hieda et al.

It is certified that error appears in the above-identified patent and that said Letters Patent is hereby corrected as shown below:

Column 8, lines 28-29, please delete "methyl-H-quinolate" and insert therefore -- methyl-8-quinolate --;

Column 9, line 16, please delete "oppose" and insert therefore -- opposite --;

Column 9, line 17, please delete "contacts to the electrode region 13" and insert therefore -- contacts the electrode region 13 --;

Column 9, line 34, please delete "mixtures of those" and insert therefore -- mixtures of these --;

Column 9, line 55, please delete "from damaging" and insert therefore -- from being damaged --;

Column 10, line 3, please delete "may have also multiple" and insert therefore -- may also have a multiple --;

Column 10, line 9, please delete "contact to the" and insert therefore -- contact the --;

Column 10, line 21, please delete "an ion sputtering" and insert therefore -- a sputtering --;

Column 10, line 34, please delete "when being" and insert therefore -- when placed --;

Column 11, line 24, please delete "is also producible" and insert therefore -- can also be produced --;

Column 11, line 32, please delete "then anode 10" and insert therefore -- the anode 10 --;

Column 11, line 41, please delete "EL, device 1" and insert therefore -- El device 1 --;

Column 11, line 53, please delete "is made an" and insert therefore -- is taken to an --;

Column 12, line 48, please delete "letter's" and insert therefore -- latter's --;

UNITED STATES PATENT AND TRADEMARK OFFICE
CERTIFICATE OF CORRECTION

PATENT NO.        : 7,196,466 B2
APPLICATION NO.   : 10/926383
DATED             : March 27, 2007
INVENTOR(S)       : Masato Hieda et al.

Figure 7B:
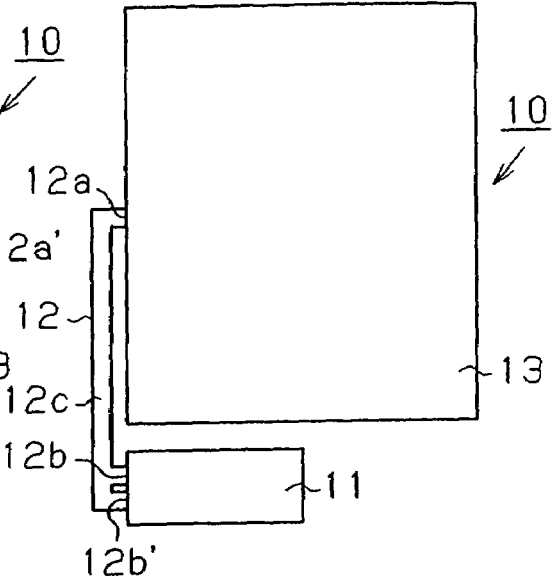

It is certified that error appears in the above-identified patent and that said Letters Patent is hereby corrected as shown below:

Column 13, line 20, please delete "small as the" and insert therefore -- small through the --;

Column 13, line 33, please delete "part of" and insert therefore -- parts of --;

Column 14, line 28, please delete "along with the" and insert therefore -- along the --;

Column 14, line 47, please delete "as shown in 7(b)" and insert therefore -- as shown in FIG. 7(b) --;

Column 14, line 64, please delete "part of portion" and insert therefore -- part of the portion --;

Column 15, line 4, please delete "periphery, of" and insert therefore -- periphery of --;

Column 15, line 24, please delete "of outer periphery" and insert therefore -- of the outer periphery --;

Column 15, line 25 and line 41, please delete "of anode" and insert therefore -- of the anode --;

Column 15, line 46, please delete "smallest. Or, the" and insert therefore -- smallest, or the --;

Column 15, line 53, please delete "showed in" and insert therefore -- shown in --;

Column 15, line 64, please delete "made each second" and insert therefore -- made at each second --;

Column 16, line 2, please delete "position, which the" and insert therefore -- position where the --;

Column 16, line 3, please delete "this position" and insert therefore -- the connecting position --;

UNITED STATES PATENT AND TRADEMARK OFFICE
CERTIFICATE OF CORRECTION

PATENT NO. : 7,196,466 B2
APPLICATION NO. : 10/926383
DATED : March 27, 2007
INVENTOR(S) : Masato Hieda et al.

It is certified that error appears in the above-identified patent and that said Letters Patent is hereby corrected as shown below:

Column 16, line 9, please delete "higher, then" and insert therefore -- higher than --;

Column 16, line 25, please delete "along with the" and insert therefore -- along the --;

Column 16, line 37, please delete "is producible" and insert therefore -- may be produced --;

Column 16, line 53, please delete "or a material inactive" and insert therefore -- or an inactive material --;

Column 17, line 3, please delete "14 win be" and insert therefore -- 14 will be --;

Column 17, line 49, please delete "in outsides of sides" and insert therefore -- in opposite sides --;

Column 17, line 50, please delete "where face each other." and insert therefore -- where they face each other. --;

Column 17, line 61, please delete "side or the" and insert therefore -- side of the --;

Column 18, line 2, please delete "contacts to an" and insert therefore -- contacts an --;

Column 18, line 6, please delete "11 and 11" and insert therefore -- 11 and 11' --;

Column 18, line 31, please delete "13 2, 13 4" and insert therefore -- 13-2, 13-4 --;

Column 18, line 43, please delete "At shown" and insert therefore -- As shown --;

Column 18, line 55, please delete "nearby one" and insert therefore -- near one --;

Column 18, line 56, please delete "aide 13-1" and insert therefore -- side 13-1 --;

Column 18, line 57, please delete "easy, in addition," and insert therefore -- easy. In addition, --;

UNITED STATES PATENT AND TRADEMARK OFFICE
CERTIFICATE OF CORRECTION

PATENT NO. : 7,196,466 B2
APPLICATION NO. : 10/926383
DATED : March 27, 2007
INVENTOR(S) : Masato Hieda et al.

It is certified that error appears in the above-identified patent and that said Letters Patent is hereby corrected as shown below:

Column 18, line 58, please delete "nearby one side to an electrode" and insert therefore -- near one side of an electrode --;

Column 18, line 60, please delete "devise" and insert therefore -- device --;

Column 18, line 61, please delete "nearby" and insert therefore -- near --;

Column 18, line 62, please delete "like a personal" and insert therefore -- like in a personal --;

Column 18, line 64, please delete "is, a luminous region rather than" and insert therefore -- is, in a luminous region as compared to --;

Column 19, line 1, please delete "anode are suitably set" and insert therefore -- anode, suitably set --;

Column 20, line 5, please delete "BaTlO$_3$" and insert therefore -- BaTiO$_3$ --;

Column 20, line 22, please delete "from contacting to" and insert therefore -- from coming in contact with --;

Column 20, line 60, please delete "scaling member" and insert therefore -- sealing member --;

Column 20, line 64, please delete "moisture-absorbent" and insert therefore -- moisture absorbent --;

Column 21, line 9, please delete "gas, which" and insert therefore -- gas which --;

Column 21, line 17, please delete "component or the anode 10" and insert therefore -- component of the anode 10 --;

Column 21, line 53, please delete "except" and insert therefore -- besides --;

Column 22, line 8, please delete "contacts to the" and insert therefore -- contacts the --;

Column 22, line 24, please delete "electrode, region" and insert therefore -- electrode region --;

UNITED STATES PATENT AND TRADEMARK OFFICE
CERTIFICATE OF CORRECTION

PATENT NO.        : 7,196,466 B2
APPLICATION NO.   : 10/926383
DATED             : March 27, 2007
INVENTOR(S)       : Masato Hieda et al.

It is certified that error appears in the above-identified patent and that said Letters Patent is hereby corrected as shown below:

Column 22, lines 36-37, please delete "second joint. 12a" and insert therefore -- second joint 12a --;

Column 22, line 42, please delete "plant" and insert therefore -- slant --;

Column 23, line 4, please delete "contacting to the" and insert therefore -- contacting the --;

Column 23, line 16, please delete "is connected" and insert therefore -- are connected --;

Column 23, line 18, please delete "terminal-section" and insert therefore -- terminal section --;

Column 23, lines 32-33, please delete "every three locations are provided" and insert therefore -- are provided every three locations --;

Column 23, line 38, please delete "every one location are provided" and insert therefore -- are provided every one location --;

Column 23, line 45, please delete "any electrodes" and insert therefore -- the electrodes --;

Column 23, line 53, please delete "both of electrodes" and insert therefore -- both of the electrodes --;

Column 24, line 3, please delete "EL device" and insert therefore -- EL device. --;

Column 24, line 15, please delete "substrate than an ITO" and insert therefore -- substrate with an ITO --;

Column 24, line 19, please delete "length was prepared." and insert therefore -- length. --;

Column 25, line 12, please delete "connected, a 150 mA constant current is flowed," and insert therefore -- connected. A 150 mA constant current flow is begun --;

UNITED STATES PATENT AND TRADEMARK OFFICE
CERTIFICATE OF CORRECTION

PATENT NO. : 7,196,466 B2
APPLICATION NO. : 10/926383
DATED : March 27, 2007
INVENTOR(S) : Masato Hieda et al.

It is certified that error appears in the above-identified patent and that said Letters Patent is hereby corrected as shown below:

Column 25, line 13, please delete "after 5 minutes since the current has been flowed, the" and insert therefore -- after 5 minutes, the --;

Column 25, line 17, please delete "was determined" and insert therefore -- were determined --;

Column 25, line 19, please delete "by 10 equally" and insert therefore -- by ten equally --;

Column 25, line 36, please delete "a point of having provided a 10-mm long notch G," and insert therefore -- that it has a point provided with a 10 mm long notch G --;

Column 25, line 47, please delete "except a point of having" and insert therefore -- except that it has a point --;

Column 25, line 48, please delete "provided a 20-mm" and insert therefore -- provided with a 20 mm --;

Column 25, line 61, please delete "anode, and luminance" and insert therefore -- anode. Luminance --;

Column 26, Table 1, Example 2, line 2, please delete "1.00" and insert therefore -- 1.10 --; and Column 26, Table 1, Comparative Example 1, line 7, please delete "2.05" and insert therefore -- 2.08 --;

Signed and Sealed this

Tenth Day of November, 2009

David J. Kappos
*Director of the United States Patent and Trademark Office*